United States Patent [19]
Korleski, Jr.

[11] Patent Number: 5,879,794
[45] Date of Patent: *Mar. 9, 1999

[54] ADHESIVE-FILLER FILM COMPOSITE

[75] Inventor: Joseph E. Korleski, Jr., Newark, Del.

[73] Assignee: W. L. Gore & Associates, Inc., Newark, Del.

[*] Notice: The term of this patent shall not extend beyond the expiration date of Pat. No. 5,753,358.

[21] Appl. No.: 745,396

[22] Filed: Nov. 8, 1996

Related U.S. Application Data

[63] Continuation-in-part of Ser. No. 591,043, Jan. 25, 1996, Pat. No. 5,753,358, and Ser. No. 597,345, Feb. 6, 1996, Pat. No. 5,766,750, which is a continuation-in-part of Ser. No. 399,702, Mar. 3, 1995, abandoned, which is a continuation-in-part of Ser. No. 295,952, Aug. 25, 1994, abandoned, said Ser. No. 591,043, is a continuation-in-part of Ser. No. 398,329, Mar. 3, 1995, abandoned, which is a continuation-in-part of Ser. No. 295,952.

[51] Int. Cl.$^6$ .............................. B32B 5/18; B32B 27/04; B32B 27/20; B32B 27/32

[52] U.S. Cl. ..................................... 428/317.1; 428/304.4; 428/315.5; 428/317.7; 428/317.9; 428/318.4; 428/319.1; 428/319.3; 428/319.7; 428/319.9; 428/323; 428/328; 428/329; 428/331; 428/413; 428/421; 428/422; 428/457; 428/461; 428/463; 428/522; 428/523; 428/901; 428/355 EN; 428/355 BL; 442/164; 442/170; 442/171; 442/172; 442/173; 442/175; 442/178; 442/179; 442/180; 442/417; 442/324; 442/325

[58] Field of Search ...................... 428/355 EN, 355 BL, 428/304.4, 306.6, 308.4, 311.1, 314.2, 315.5, 316.6, 317.1, 317.7, 317.9, 318.4, 323, 328, 329, 330, 331, 413, 421, 422, 319.1, 319.3, 319.7, 319.9, 457, 461, 463, 522, 523, 901; 442/324, 325, 322, 164, 170, 171, 173, 285, 172, 175, 178, 179, 180, 417

[56] References Cited

U.S. PATENT DOCUMENTS

| | | | |
|---|---|---|---|
| 3,407,249 | 10/1968 | Landi | 264/49 |
| 3,929,721 | 12/1975 | Leverett | 260/42.15 |
| 3,953,566 | 4/1976 | Gore | 264/288 |
| 3,963,850 | 6/1976 | Doss et al. | 428/286 |
| 4,038,244 | 7/1977 | Odgen et al. | 260/42.16 |
| 4,143,110 | 3/1979 | Morozumi et al. | 264/117 |
| 4,169,184 | 9/1979 | Pufahl | 428/311 |
| 4,187,390 | 2/1980 | Gore | 174/102 |
| 4,231,916 | 11/1980 | Knappenberger et al. | 260/37 |
| 4,241,132 | 12/1980 | Pratt et al. | 428/285 |

(List continued on next page.)

FOREIGN PATENT DOCUMENTS

| | | |
|---|---|---|
| 12 13950 | 11/1986 | Canada . |
| 61-40328 | 2/1986 | Japan . |
| 62-100539 | 5/1987 | Japan . |
| 2195269 | 1/1990 | United Kingdom . |
| 93 20562 | 10/1993 | WIPO . |

OTHER PUBLICATIONS

"Using GORE–TEX Reduces Signal Delay in PC Board" Electronics; Jun. 2, 1986; McGraw–Hill, Inc.

Primary Examiner—Vivian Chen
Attorney, Agent, or Firm—Victor M. Genco, Jr.

[57] ABSTRACT

A method of preparing an adhesive composite is provided where a fluoropolymer having nodes and interconnected fibrils with a void volume formed from the node and interconnected fibril structure is at least partially filled with a paste formed from a thermoset or thermoplastic adhesive and a particulate vapor phase formed inorganic filler having uniform surface curvature, sufficient adhesive and filler are present to provide a composite having between about 5 to about 40 volume percent polymeric substrate, 10–95 volume percent adhesive and filler imbibed within the voids of said substrate and 5 to 85 volume percent inorganic filler is contained within the composite. In the composite, the ratio of mean flow pore size to largest particle size is at least above 0.7; or the ratio of mean flow pore size to average particle size is greater than 1.5; or the ratio of minimum pore size to average particle size is at least above 0.8; or the ratio of minimum pore size to largest particle size is at least above 0.4.

80 Claims, 5 Drawing Sheets

U.S. PATENT DOCUMENTS

| | | | |
|---|---|---|---|
| 4,293,519 | 10/1981 | Knappenberger et al. | 264/272.13 |
| 4,312,914 | 1/1982 | Guth | 428/290 |
| 4,437,865 | 3/1984 | Parekh et al. | 51/298 |
| 4,440,879 | 4/1984 | Kawachi et al. | 523/200 |
| 4,482,516 | 11/1984 | Bowman | 264/127 |
| 4,661,301 | 4/1987 | Okada et al. | 264/41 |
| 4,680,220 | 7/1987 | Johnson | 428/241 |
| 4,705,762 | 11/1987 | Ota et al. | 501/87 |
| 4,747,897 | 5/1988 | Johnson | 156/148 |
| 4,772,509 | 9/1988 | Komada et al. | 428/251 |
| 4,784,901 | 11/1988 | Hatakeyama et al. | 428/268 |
| 4,798,762 | 1/1989 | Okada et al. | 428/285 |
| 4,803,115 | 2/1989 | Fushiki et al. | 428/285 |
| 4,892,669 | 1/1990 | Marcora et al. | 252/30 |
| 4,985,296 | 1/1991 | Mortimer, Jr. | 428/220 |
| 5,034,801 | 7/1991 | Fischer | 357/72 |
| 5,055,342 | 10/1991 | Markovich et al. | 428/137 |
| 5,087,641 | 2/1992 | Sato | 521/53 |
| 5,126,192 | 6/1992 | Chellis et al. | 428/323 |
| 5,141,972 | 8/1992 | Sato | 523/218 |
| 5,202,117 | 4/1993 | Kamper | 428/257 |
| 5,753,358 | 5/1998 | Korleski | 428/308.4 |
| 5,766,750 | 6/1998 | Korleski | 428/308.4 |

ADHESIVE-FILLER FILM COMPOSITE

RELATED APPLICATIONS

This application is a Continuation-In-Part application of Ser. No. 08/591,043, filed Jan 25, 1996, now U.S. Pat. No. 5,753,358, which issued on May 19, 1998; and a Continuation-In-Part application of Ser. No. 08/597,345, filed Feb. 6, 1996, now U.S. Pat. No. 5,766,750, which issued on Jun. 16, 1998; Ser. No. 08/591,043, now U.S. Pat. No. 5,753,358, is a Continuation-In-Part application of U.S. Ser. No. 08/398,329, filed Mar. 3, 1995, abandoned, which is a Continuation-In-Part application of U.S. Ser. No. 08/295,952, filed Aug. 25, 1994, abandoned. Ser. No. 08/597,345, now U.S. Pat. No. 5,766,750, is a Continuation-In-Part of U.S. Ser. No. 08/399,702, filed Mar. 3, 1995, abandoned, which is a Continuation-In-Part application of U.S. Ser. No. 08/295,952, filed Aug. 25, 1994, abandoned.

FIELD OF THE INVENTION

The present invention relates to composites which are manufactured from non-woven substrates that are compliant and imbibed or impregnated with a filler-adhesive mixture and can be used in electronic components. The imbibed filler provides the composite with thermal and/or mechanical and/or electrical properties. The present invention also relates to a method of making composites that are imbibed with a filler-adhesive mixture. Specifically, the present invention provides thin fluoropolymer film composites where a filler-adhesive mixture is uniformly distributed in the voids of the fluoropolymer.

BACKGROUND OF THE INVENTION

Polymeric materials in sheet or film form containing fillers and are suitable for use in the electronics industry in the manufacture of electronic substrates, chip packages, circuit boards and other electronic devices or in the separating technologies where filters, separators or membranes are required. The ultimate use of the film and the particular property that the film will exhibit determines the selection of the specific filler. For example, activated carbon can be incorporated into the film to provide a filter or separator. Electrical properties can be attributed to a polymer film by incorporating fine metal particulates to impart electrical conductivity. Frequently, the film is a polymeric adhesive and the metal particles provide the film with the requisite electrical property. Thermal conductivity can be obtained by adding a ceramic and/or metal and/or diamond into the adhesive.

Adhesive films can be formed from (1) a solution or paste that will polymerize to form the "polymeric" film, or (2) a polymeric substrate having an adhesive added thereto. In either case, as the quantity of filler is increased to provide the desired electrical/thermal property, the physical properties of the adhesive are degraded to a point of limited utility. For example, a typical conductive adhesive might have as much as 40–60% (v/v) filler. However, these adhesives are very weak and brittle, and are only useful when dispensed as a paste/liquid. If a film can be made from these compositions, they are difficult to handle in the "B" staged form, limiting their size and thickness.

One approach to overcome the shortcomings of filled adhesives is to limit the quantity of the filler that is added. A separate approach is to add a reinforcement material like woven glass fiber. However, in both of these approaches, the performance of the filled adhesive is severely compromised when this is done. As a result, less than the desired amount of filler material is used. The resulting sheet adhesive can be worked, but the desired or optimal property and performance are not obtainable. Thus, existing filled adhesives sacrifice performance for usability.

In addition, particle filled sheet adhesives suffer from a phenomenon known as "particle settling" or sedimentation. The heavy particles (up to 10× the density of the resin) will sink to the bottom of the film, leaving a resin rich surface. This phenomenon results in undesirable inhomogeneities and poor reliability. High bond pressures are often required to insure that the excess surface resin is pushed back into the film. Even so, surface irregularities, could still result in resin rich areas that would be deficient in the property supplied by the particle.

Attempts at preparing filled film adhesives have been made, but significant drawbacks exist and therefore their preparation are limited. The quantity of filler that can be added is controlled by the physical limitations of: (1) polymeric film or substrate; and (2) the filler-adhesive additive. Often, the desired quantity of filler renders the adhesive-filler additive impossible to handle.

Thermosetting resins have been imbibed into substrates to impart structural integrity to an otherwise brittle layer. For example, a woven glass substrate can be imbibed with a thermosetting or thermoplastic adhesive. However, this approach has significant drawbacks when a filler is also added. For example, hollow glass microspheres have been dispersed into a thermosetting adhesive and then imbibed into a woven substrate. However, the amount of filler that can be delivered to the substrate is limited because the flexibility and manipulability of the resulting adhesive film is poor and it is difficult to conform the adhesive film for the desired applications.

Another drawback to such a composite is the limited homogeneity possible with the woven structure. At every interstice of the weave lies a composition that is different than the volume defined between the interstices. This results in inhomogeneities in physical properties, electrical properties, and in conformability. It would be desirable to have a filled adhesive sheet that is homogeneous and flexible at wide ranges of filler level.

Also, although curing additives have been added into a pressure-sensitive adhesive, and then imbibed into a polyurethane foam, the nature of the scaffolding, poses many limitations. As a result, it is very difficult to make thin composites, or flexible, thermally stable composites. Flame retardant particles have also been dispersed into an adhesive and then imbibed into a non-woven polyimide-ester substrate for use as a flame-retarded flexible circuit substrate. In general, in these prior art systems, dispersing an additive into an adhesive at an optimal level for performance sake and at the same time providing that adhesive as a thin sheet is not feasible.

Fillers have also been incorporated into fluoropolymers, such as porous, expanded polytetrafluoro-ethylene (ePTFE), by directly adding the filler to the fluoropolymer prior to extrusion and expansion. Thin porous polytetrafluoroethylene films filled with inorganic filler that are between 0.1 and 5.0 mils thick and substantially pin hole free are also known, as are thin capacitive polytetrafluoroethylene layers for printed wire circuit boards (PWB). The porous expanded polytetra-fluoroethylene used can be prepared in accordance with the teachings of U.S. Pat. No. 3,953,566 to Gore. In each case, the filler is admixed with the polymer prior to extrusion and expansion.

Polytetrafluoroethylene that has not been expanded, and thus does not include the fibril-node micro-structure of expanded polytetrafluoroethylene, can also include fillers. Extruded composite tapes of ceramic filler and polytetrafluoroethylene with dielectric properties have been prepared by adding the filler to the polytetrafluoroethylene prior to extrusion. Silane compounds can also be desirable for providing uniformity and improved dispersibility when aqueous polytetrafluoroethylene-filler dispersions are prepared. See U.S. Pat. No. 3,929,721 to Leverett and U.S. Pat. No. 4,038,244 to Ogden, et al. In addition to silanes, other organic compounds that render hydrophilic fillers hydrophobic, for better dispersibility, are also known. See U.S. Pat. No. 4,440,879 to Kawachi, et al. and U.S. Pat. No. 4,143,110 to Morozumi. It is also known to precoat filler with a coupling agent, e.g. a silane, titanate, etc. prior to paste extrusion Composites formed in these patents require bonding at "sintering" temperatures—i.e., at very high temperatures or at high temperature and pressure. As a result, these composites have not been used to the extent contemplated, especially because of the difficulty encountered when the composites are further processed. This is particularly the case when the other materials being bonded to these composites cannot withstand these elevated temperatures and pressures.

Other attempts to avoid these drawbacks have been made, but the results have been unsatisfactory. Porous fibrillated polytetrafluoroethylene has been prepared according to the technique taught in U.S. Pat. Nos. 3,407,096 and 3,407,249 to Landi. In the Landi patents, inorganic or organic fillers are incorporated into the network of unsintered polytetrafluoroethylene fibers. The Landi process involves preparing a blend of polytetrafluoroethylene and an organic polymer that is extruded. The organic polymer is subsequently removed by dissolving in an appropriate solvent. The resulting structure precludes the introduction of additional particulate fillers because of the very fine fibril network.

In U.S. Pat. No. 5,141,972 to Sato, gas-containing microballoons or spheres are used to form an insulating porous composite with polytetrafluoroethylene. In the Sato patent, the polytetrafluoroethylene substrate has a porosity of about 75% and is dipped into an ultrasonically-stirred liquid containing microballoons, allowing the spheres to flow into the pores. The imbibed substrate is heated without restraint, thus shrinking the porous polytetrafluoroethylene so as to fix the microspheres in the pores. The product produced, according to the Sato patent, is useful as a porous compressive-resistant, low dielectric. The spheres fill the pores and thus prevent the pores from being collapsed. Using the same approach, in U.S. Pat. No. 5,087,641 to Sato, porous polytetrafluoroethylene composites with sintered polytetrafluoroethylene particles within the pore volume are fabricated. In each case, the Sato composites cannot satisfactorily be imbibed with resin, and as such, would be very difficult to use as an adhesive.

Although the prior art has produced substrates that contain fillers, the addition of an adhesive to the particle being produced has not resulted in acceptable products. For example, in Japanese Laid-open-patent application 61-40328 to S. Hamasaki, et al., silicone rubber is imbibed into a porous expanded polytetrafluoro-ethylene structure for use as a thin electrical insulator with a thickness not greater than 50 mm. The silicone rubber is imbibed as a solution and results in a product that is transparent, e.g., free of filler, that is subsequently cured. However, the structural integrity of the cured product is poor. In an attempt to reinforce the structure of the Hamasaki patent, H. Kato, et al., in Japanese Laid-open-patent 62-100539, teach a silicone rubber article which is made by first incorporating a ceramic into a dispersion of polytetrafluoroethylene. The filler is incorporated directly into the nodes of the node-and-fibril structure, and thereafter the silicone resin is imbibed into said fibrillated structure as described above. In both of these instances, the final product is a rubber-like cured sheet.

In a similar fashion, M. Hatakayama, et al., in GB-2195269B (EP-0248617B1), describes an article and process of imbibing expanded polytetrafluoroethylene with a thermosetting resin which is useful as an adhesive for printed wiring boards (PWB). An inorganic filler could be incorporated into the node-fibril structure of the expanded porous polytetrafluoroethylene. See also U.S. Pat. No. 4,784,901 to Hatakayama, et al. who impregnates a resin without filler into polytetrafluoroethylene.

Unfortunately, with these approaches, it is difficult to attain high degrees of ceramic loading because the ceramic serves to weaken the node and fibril structure. It is difficult to make thin films of filler-reinforced polytetrafluoroethylene because as the material thickness is reduced, the filler/fiber particulate creates pinhole tears. Furthermore, incorporating inorganic fillers, especially in the range greater than 30 volume percent, makes mixing and paste extrusion processing of these composites very difficult. An additional misfortune is that the ceramic reinforcement is not uniformly distributed throughout the composite structure.

A need exists for a uniformly reinforced, thin adhesive sheet composite that is capable of retaining high levels of reinforcement. Thus, a need exists for structurally reliable, filled-adhesive films that contain the greatest possible quantity of filler to maximize the desired property without sacrificing structural integrity. These films should: be as thin or as thick as possible, be in an easy-to-use, convenient sheet form which is not brittle, have uniform consistency and be pinhole free.

The subject invention, described below, overcomes these and other drawbacks of the prior art.

SUMMARY OF THE INVENTION

The present invention is directed to porous non-woven substrates that are imbibed with high quantities of filler and a thermoplastic or thermoset adhesive, as a result of the initial void volume of the polymeric substrate. In particular, fluoropolymers, porous expanded polytetrafluoroethylene material of U.S. Pat. No. 3,953,566 to Gore and U.S. Pat. No. 4,482,516 to Bowman, et al., each of which is incorporated herein by reference, can be used in the subject invention and are imbibed with an adhesive-filler paste mixture to provide a composite for use in the electronics industry and elsewhere. Other highly porous materials, such as porous polyethylene or porous, expanded polypropylene can be used.

Accordingly, it is a primary purpose of the present invention to form a composite where a thermoset or thermoplastic adhesive resin and particulate filler, combined as a paste, are infused, imbibed or impregnated into the voids of a porous polymer. The porous polymer substrate has an initial void volume of at least 30%, preferably at least 50%, and most preferably at least 70%, and facilitates the thermoset or thermoplastic adhesive resin and particulate filler paste in the voids while providing a flexible reinforcement to prevent brittleness of the overall composite and settling of the particles.

One aspect of the present invention is to provide an open cellular composite having between about 5 to about 40 volume percent substrate with 10–95 volume percent particulate filled adhesive imbibed within the voids of the substrate.

A further aspect of the present invention is to provide a process and composite whereby 5 to 85 volume percent inorganic particulate filler is contained within the composite, either in the structure of the porous polymer, or in the adhesive, or both.

It is a still further aspect of the present invention to provide a film of expanded polytetrafluoro-ethylene having a void volume of at least 50 percent containing an evenly distributed adhesive-filler paste mixture where the filler is 5 to 85 volume percent of the volume of the composite.

It is a further aspect of the present invention to provide a film of expanded polytetrafluoroethylene having an initial void volume of at least 30 percent and containing an adhesive-filler paste mixture where the filler is 5 to 85 volume percent of the volume of the composite and the ratio of the average pore size of the polytetrafluoroethylene to the average particulate size should be at least above 1.4, preferably not less than 2.5. Another design criteria is that the ratio of the minimum pore size ($Pore_{Min}$) to the average particle size ($Part_{Avg}$) should be at least above 0.8, or that the ratio of the minimum pore size ($Pore_{Min}$) to the maximum particle size ($Part_{Max}$) should be at least above 0.4, or that the ratio of the MFPS to $Part_{Max}$ is at least above 0.7. A further design criteria is that the pore size in the substrate and particle size may be calculated as the smallest pore size of the PTFE being not less than 1.4 times the largest particle size.

An additional aspect of the present invention is to provide a composite having a fluoropolymer substrate with nodes interconnected by fibrils with a thermoset or thermoplastic adhesive and ceramic particles located within the voids of the fluoropolymer substrate which is partially cured to form a B-stage composite.

It is a further aspect incorporate filler particles having a uniform surface curvature into a non-woven substrate such as batts, felts or open cellular porous substrates.

It is an object of the present invention to provide an adhesive-filler containing substrate for an electronic device containing one or more layers of a composite of the subject invention having at least one layer containing a conductive metal.

It is still another object of the present invention to provide a filler-adhesive mixture containing at least two different types of filler, at least one of which is non-conductive carbon.

These and other objects, aspects and advantages of the present invention will become evident from review of the following description. The operation of the present invention should become apparent from the following description when considered in conjunction with the accompanying non-limiting drawings and claims.

DETAILED DESCRIPTION OF THE INVENTION

Figure 1:
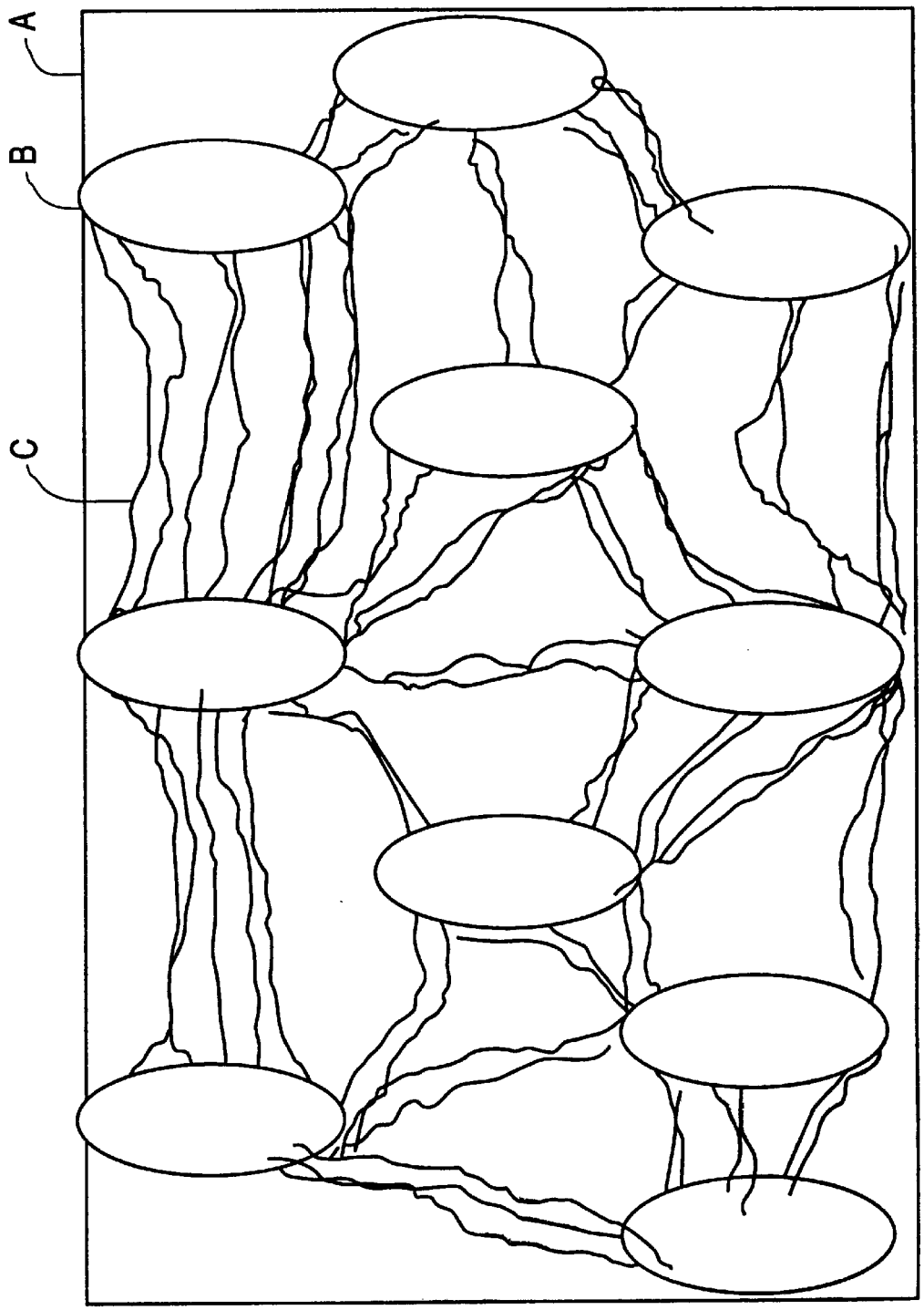
FIG. 1 illustrates an expanded or stretched polytetrafluoroethylene film (A) containing nodes (B) and interconnected with fibrils (C) without a particulate filler.

It has now been discovered that porous substrates having an initial void volume of between 30 and 95 percent, preferably at least 50 percent and often more than 70 percent, provide a scaffold substrate for imbibing adhesives containing fillers with well controlled thicknesses. After the adhesive-filler mixture is impregnated into the porous substrate, the loaded substrate is exposed to heat to partially cure the adhesive and form a B-stage adhesive composite. Porous expanded polyolefins, such as ultra high molecular weight (UHMW) polyethylene, expanded polypropylene, fluoropolymers, such as porous expanded polytetrafluoroethylene, with or without copolymers thereof, porous polytetrafluoroethylene made prepared by paste extrusion and incorporating sacrificial fillers, porous inorganic or organic foams, microporous cellulose acetate, etc., exemplify some of the substrates that may be used in the present invention. These materials provide a scaffold having a void volume that allows a paste of a thermoplastic or thermosetting resin with or without a filler to be imbibed into the voids of the substrate scaffold. As a result, high loadings of inorganic fillers, e.g., ceramic fillers in particulate or fibrous form, solid ceramic fillers having uniform surface curvature, metals in powder form, in thermosetting or thermoplastic adhesives, can be achieved by the invention described herein, while still producing a compliant, pliable convenient-to-use and easy to handle sheet adhesive, free from tears or pinholes in the thin film. This result is unexpected because a typical sheet of filled adhesive is very fragile and brittle, and not handleable at all. The surprising results are due to the flexible nature of the highly porous and/or expanded substrates, such as, expanded polytetrafluoroethylene.

Traditionally, a "strong" reinforcement material has been used to hold the composite together. In contrast, this invention uses a low modulus reinforcement at a much lower percentage of composition than has been achievable with strong reinforcements. This provides much higher filler percentages than formerly thought possible.

In one embodiment of the present invention a scaffold is formed from the minute interconnected network of nodes and fibrils that serve as the inter-penetrating network within the filled adhesive. An added unexpected advantage is that the thickness of the adhesive composites made with expanded polytetrafluoroethylene are tightly controlled in thickness by the substrate/scaffold thickness. Thus, paste thickness control of the coating process is not the controlling parameter of the present invention which is beneficial because of the nature of the paste, e.g., its viscosity and thickness is susceptible to many variables. Instead, the thickness and structure of the starting substrate which may be a thin or thick film controls the imbibing process and the nature of the final product even when the scaffold makes up as little as 5% of the composite. As a result, very closely controlled thicknesses of adhesive, especially filled adhesives, can be reliably made. This is especially important for electronic and microelectronic dielectric layers.

Another unexpected benefit of the present invention is that consistent and homogeneous dispersions of particles in adhesives can be introduced into a microporous structure. This provides a number of important benefits, including: a toughening effect due to the microporosity of the substrate; and a homogeneity effect because the microporous substrate tends to keep the dispersion evenly distributed (i.e., migratia of particulate is reduced by virtue of the fact that the particulate is more or-less contained with a scaffold).

More specifically the composite compositions of this invention comprise, but are not limited to, a layer or film of porous filled or unfilled expanded polytetrafluoroethylene that contains 5 to 40 volume percent polytetrafluoroethylene, 10–95 volume percent particulate filled adhesive imbibed within the porous structure of the polytetrafluoroethylene web. The filler may be distributed throughout the adhesive in the form of particulates suspended in the adhesive. Alternatively or in addition, the polytetrafluoroethylene may contain the same or different particulate filler in the fibril-node structure of the film to impart thermal conductivity and/or electrical conductivity or impart other properties or augment the same property. In all cases, the particulate filler constitutes 5 to 85 volume percent of the total composite.

Particulate-filled adhesives are adhesives which have suspended in them one or more of the following: metals and alloys such as, but not limited to, nickel, copper, aluminum, silicon, solder, silver, gold, metal-plated particulate such as silver-plated copper, silver-placed nickel, silver-plated glass microspheres, inorganics such as $BaTiO_3$, $SrTiO_3$, $SiO_2$, $Al_2O_3$, BN, ZnO, $ZrO_2$, $TiO_2$, MnO, CuO, $Sb_2O_3$, WC, sol-gel ceramics (such as sol-gel $SiO_2$, $TiO_2$ or $Al_2O_3$), or precipitated ceramics (such as $SiO_2$, $TiO_2$ or $Al_2O_3$), fused silica, fumed silica, amorphous fused silica, inorganic filler made by the vapor metal combustion process taught in U.S. Pat. No. 4,705,762, where molten silicon, titanium and aluminum are vapor combusted to produce silica, titania, and alumina particles that are solid in nature, i.e., not a hollow sphere, with a uniform surface curvature and a high degree of sphericity.

The fillers may be used alone or in combination with one another. For example, silica and non-conductive carbon, titania and non-conductive carbon, etc. sol-gel titanates, mixed titanates, ion exchange resins, lithium-containing ceramics, hollow glass microspheres, carbon-based materials such as carbon, activated charcoal, carbon black, furnace black, ketchem black, diamond powder, and elastomers, such as polybutadiene, polysiloxane, and semi-metals, ceramic fillers may also be used. Some of the fillers used in the embodiments of the present invention include $BaTiO_2$, $SiO_2$, $Al_2O_3$, ZnO, $ZrO_2$, $TiO_2$, nickel or solder. Other embodiments disclosed can use $SiO_2$, $TiO_2$, and $Al_2O_3$ which are formed from the combustion of the molten silicon, titanium, zirconium, and aluminum to produce particles that are solid in form, i.e., not hollow spheres, have a high degree of sphericity and a uniform surface curvature.

The particulates provide the adhesive with one or more specific properties, such as thermal conductivity, electrical conductivity, dimensional stability, low dielectric constant, high-dielectric constant, ion-exchange capabilities, galvanic potential, flame retardancy, tailorable coefficients of thermal expansion, etc. By "particulate", is meant fillers of any aspect ratio. Thus, the term includes both fibers and powders.

The fillers may be treated by well-known techniques that render the filler hydrophobic by silylating agents and/or agents reactive to the adhesive matrix, such as by using coupling agents. Suitable coupling agents include, silanes, titanates, zirconates, and aluminates. Suitable silylating agents may include, but are not limited to, functional silyating agents, silazanes, silanols, siloxanes. Suitable silazanes, include, but are not limited to, hexamethyldisilazane (Huls H730) and hexamethylcyclotrisilazane, silylamides such as, bis(trimethylsilyl)acetamide (Huls B2500), silylureas such as trimethylsilylurea, and silylmidazoles such as trimethylsilylimidazole.

Titanate coupling agents are exemplified by the tetra alkyl type, monoalkoxy type, coordinate type, chelate type, quaternary salt type, neoalkoxy type, cycloheteroatom type. Preferred titanates include, tetra alkyl titanates, Tyzor® TOT {tetrakis(2-ethyl-hexyl) titanate, Tyzor®) TPT {tetraisopropyl titanate}, chelated titanates, Tyzor® GBA {titanium acetylacetylacetonate}, Tyzor® DC {titanium ethylacetacetonate}, Tyzor® CLA {proprietary to DuPont}, Monoalkoxy (Ken-React® KR TTS), Ken-React®, KR-55 tetra (2,2 diallyloxymethyl)butyl, di(ditridecyl)phosphito titanate, LICA® 38 neopentyl(diallyl)oxy, tri(dioctyl)pyrophosphato titanate.

Suitable zirconates include, any of the zirconates detailed at page 22 in the Kenrich catalog, in particular KZ 55-tetra (2,2 diallyloxymethyl)butyl, di(ditridecyl)phosphito zirconate, NZ-01- neopentyl(diallyl)oxy, trineodecanoyl zirconate, NZ-09-neopentyl(diallyl)oxy, tri(dodecyl) benzene-sulfonyl zirconate.

The aluminates that can be used in the present invention include, but are not limited to Kenrich®, diisobutyl(oleyl) acetoacetylaluminate (KA 301), diisopropyl(oleyl) acetoacetyl aluminate (KA 322) and KA 489.

In addition to the above, certain polymers, such as, cross-linked vinylic polymers, e.g., divinylbenzene, divinyl pyridine or a sizing of any of the disclosed thermosetting matrix adhesives that are first applied at very high dilution (0.1 up to 1.0% solution in MEK) can be used. Also, certain organic peroxides, such as, dicumylperoxide can be reacted with the fillers.

The adhesive itself may be a thermoset or thermoplastic and can include polyglycidyl ether, polycyanurate, polyisocyanate, bis-triazine resins, poly (bis-maleimide), norbornene-terminated polyimide, polynorbornene, acetylene-terminated polyimide, polybutadiene and functionalized copolymers thereof, cyclic olefinic polycyclobutene, polysiloxanes, poly sisqualoxane, functionalized polyphenylene ether, polyacrylate, novolak polymers and copolymers, fluoropolymers and copolymers, melamine polymers and copolymers, poly(bis phenycyclobutane), and blends or prepolymers thereof. It should be understood that the aforementioned adhesives may themselves be blended together or blended with other polymers or additives, so as to impact flame retardancy or enhanced toughness.

In the present invention, expanded porous filled or unfilled substrates, include, in addition to expanded polytetrafluoroethylene and polyolefins, non-woven papers, polymer fibers, non-woven foams that are used as the scaffold/matrix material to make the film. The non-woven papers contemplated include, but are not limited to those made via the "wet-lay" and "spun-bonded" process, e.g., cellulose paper or aramid paper. Fibrous scaffold supports can include chopped fiber mats and ceramic paper. Foams can include aerosol ceramic foams or open cell polymeric foams, or poly(ethylene terephthalate) foams. Expanded scaffold materials include expanded polyethylene, microporous polymers such as cellulose acetate and the like. These materials may offer extra strength to the adhesive containing films due to the expanded form of the scaffold or matrix, and because of their low bulk modulus. The matrix serves as a scaffold to hold together an otherwise much weaker paste/dispersion of ceramic and adhesive.

In the present invention, the expanded polytetrafluoroethylene acts as the binder, and consequently, the adhesive must only display good glue qualities. The low modulus and intricate network of nodes and fibrils of the expanded polytetrafluoroethylene structure serves to toughen the overall composite similar to the inverted phase in a phase-separated polymer alloy. This allows for compositional ratios of components that would not ordinarily be practical because one classically relies on the adhesive as both a binder and as a glue.

Another key feature of the present invention is thickness control. Expanded polytetrafluoroethylene can be made very uniform and, once imbibed with resin, does not change its final thickness. Thus, overall thickness control is gained. Additionally, the thickness of expanded polytetrafluoroethylene itself can be accurately controlled and as a result, the resulting scaffold film can be made very thin or very thick. Very thin substrates have the added advantage of permitting the preparation of composites that can contain several layers.

An important aspect of the process invention lies in the use of the unusual feature of polytetrafluoro-ethylene to expand on stretching to form a porous material of interconnecting channels formed by nodes and fibrils. The stretching of polytetrafluoroethylene to form porous material is well known, and is described in U.S. Pat. Nos. 3,953,566 and 4,482,516. The void space in expanded polytetrafluoroethylene comprises at least 50% of the volume, and frequently more than 70%, while at the same time remaining very strong. When this void space is replaced with a filler, such as $SiO_2$, $TiO_2$, etc., it results in a very highly-filled composite that remains strong and easy to handle.

In the present invention, Mean Flow Pore Size and minimum pore size were determined using the Coulter® Porometer II (Coulter Electronics Ltd., Luton UK) which reports the value directly. Average particle size and largest particle size were determined using a Microtrac light scattering particle size analyzer Model No. FRA (Microtrac Division of Leeds & Northup, North Wales, Pa., U.S.A.). The average particle size (APS) is defined as the value at which 50% of the particles are larger. The largest particle size (LPS) is defined as the largest detectable particle on a Microtrac histogram. Alternatively, the largest particle size is defined at the minimum point when the Microtrak FRA determines that 100% of the particulate have passed.

Observed Density ($r_{obs}$) was calculated by dividing the observed weight in grams by the calculated volume in cubic centimeters (cc). The volume of the sample was calculated by multiplying the average thickness, length and width. Each average comprised of at least 5 separate measurements. The uncertainty associated with these measurements was carried throughout the calculations.

Calculated Density ($r_{calc}$) was calculated by the following equation: rcalc=$S(v_i)*(r_i)$; where $v_i$ is the volume fraction of the $i^{th}$ component, and $r_i$ is the density of the $i^{th}$ component.

Prepreg Resin Content (RC) was calculated by dividing the weight of a swatch of prepreg into the weight of the same swatch after exhaustively extracting out all adhesive with solvent, allowing the swatch to dry, and weighing.

Dielectric constant (Dk) at frequencies less than 3 GHz were obtained using a Hewlett-Packard 8753A Network Analyzer (Hewlett-Packard Corp., San Jose, Calif.) by the substrate resonance method on a copper-clad laminate.

Dielectric constant (Dk) and Dissipation Factor (Df) at frequencies above 5 GHz was obtained using a resonant mode dielectrometer developed by GDK products (GDK Products, Inc., Cazoniva, N.Y.) and a Hewlett Packard 8510 Network Analyzer(Hewlett-Packard Corp., San Jose, Calif.).

Copper Peel values were determined using a 90-degree peel configuration on a copper-clad laminate anchored to a rigid sliding plane substrate coupled to an Applied Test Systems Model No. 1401 computer-controlled tensile testing machine (Applied Test Systems, Inc., Butler, Pa., U.S.A.).

Compositions by weight were determined by elemental analysis by Galbraith Laboratories (Knoxville, Tenn.). $SiO_2$, $TiO_2$ and Ni composition were determined using inductively coupled plasma spectroscopy ash-fusion decomposition analysis, which was used to establish the respective amount of Si, Ti or Ni. PTFE composition was determined in a similar manner, but using fluorine by Schoniger Flask/Specific Ion Electrode Analysis, which measured fluorine directly. The amount of adhesive was calculated by difference of mass balance.

Void volume (VV) or "volume percent air" was calculated by dividing the observed density by the calculated density and subtracting from unity, while propagating the appropriate degree of uncertainty.

Volume fraction (VF) of each component was calculated multiplying the volume of mass in the composite (1-VV) by the volume fraction of each respective component. It is calculated by the following equation: $VF_i=(1-VV)*$(Volume of $i^{th}$ component/Total volume of composite)$=([(r_{obs})/(r_{calc})]*[((W_i)*(r_i)](VV+S(W_i)(r_i)]$; where $VF_i$ is the volume fraction of the $i^{th}$ component, robs is the observed density in g/cc, rcalc is the calculated density in g/cc, $w_i$ is the weight fraction of the $i^{th}$ component and $r_i$ is the density of the $i^{th}$ component in g/cc.

In general, the process of the subject invention involves: (a) expanding a polytetrafluoroethylene sheet by stretching a lubricated extruded perform to a microstructure sufficient to allow small particles and adhesives to free flow into the void or pore volume; (b) forming a paste from polymeric, e.g., thermoset or thermoplastic material and a filler; and (c) imbibing by dipping, coating, pressure feeding, the adhesive-filler paste into the highly porous scaffold, such as expanded polytetrafluoroethylene.

In one of the embodiments of the present invention, expanded porous filled or unfilled polytetra-fluoroethylene is used as the matrix material to make the film because of its extra strength imparted by its expanded form, and because of its low modulus. The matrix serves as a scaffold to hold together and provide a void volume that is receptive to otherwise much weaker paste/dispersion ceramic and adhesive. As has been noted, due to low modulus and interconnected work of nodes and fibrils, the expanded polytetrafluoroethylene structure serves to toughen the overall composite similar to the inverted phase in a phase-separated polymer alloy. This allows for compositional ratios of components that would not ordinarily be practical because one classically relies on the adhesive as both a binder and a glue. In the present invention, the expanded polytetrafluoroethylene acts as the binder, and consequently, the adhesive must only display good glue qualities. Another key feature is the thickness control. Expanded polytetrafluoroethylene can be made very uniform, and, once imbibed with resin, does not change its final thickness. Thus, overall thickness control is gained. Additionally, expanded polytetrafluoroethylene can be made very thin or very thick. In the case of very thin films, several layers can be combined to build a composite.

An important aspect of the process invention lies in the use of the unusual feature of polytetrafluoro-ethylene to expand on stretching to form a porous material of interconnecting channels formed by nodes and fibrils. The void space in expanded polytetrafluoroethylene comprises at least 30% of the volume, and frequently more than 50%, and more frequently more than 70%—yet still remaining very strong. The void space can then be replaced by an adhesive which contains a filler that imparts a desired enhancement of properties. For example, a nickel-filled adhesive would display enhanced electrical and thermal conductivities; a silica-filled ($SiO_2$) adhesive, especially where the filler is prepared from molten silicon, titanium, aluminum, that is vapor combusted and results in particles that have a uniform surface curvature, would display enhanced dimensional stability and lower coefficient of thermal expansion (CTE); a lithium-filled adhesive would display enhanced ion-exchange properties; a titanium oxide ($TiO_2$) or titanate filled adhesive would display enhanced dielectric constant, and so on. The particulate them-selves may have a thin coating of primer or other surface-modifying layer, such as a silane coating, silazane coating, siloxane, titanate, zirconate, sizing of the adhesive itself, if deemed necessary for mechanical integrity.

The features of the invention are now described by reference to non-limiting FIGS. 1 through 3.

In FIG. 1, film (A) contains no particulate filler, and shows expanded or stretched polytetrafluoroethylene film (A) containing nodes (B) (denoted by the irregular circles) interconnected with fibrils (C) (denoted by lines). Thus, FIG. 1 illustrates the node-and-fibril structure.

Figure 2:
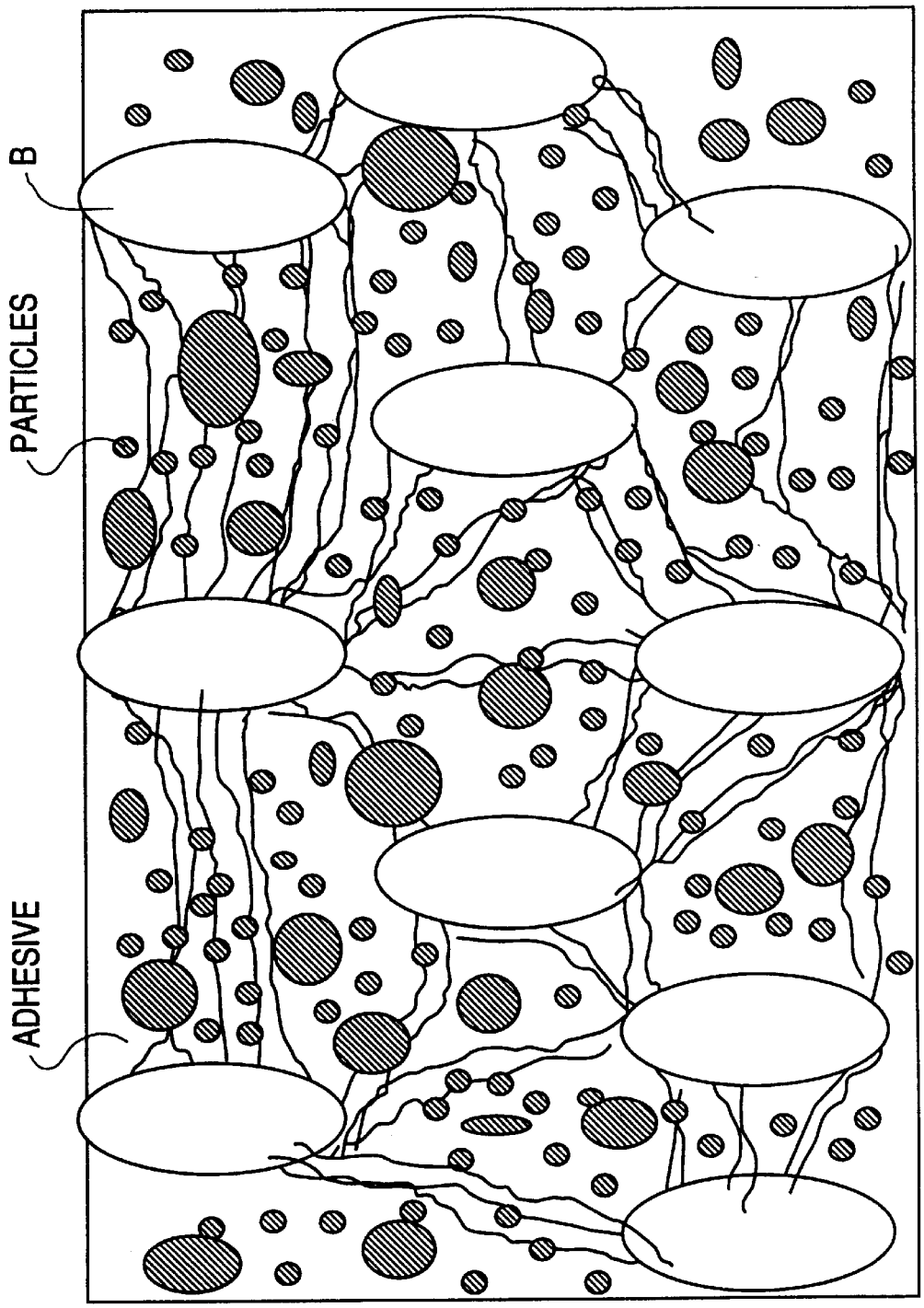
FIG. 2 illustrates an expanded or stretched polytetrafluoroethylene film where the open volume defined by a node-and-fibril structure includes a particle-filled adhesive.

In FIG. 2, the open volume defined by said node-and-fibril structure is replaced by a particle-filled adhesive. The node-and-fibril structure serves as a scaffolding for the adhesive.

Figure 3:
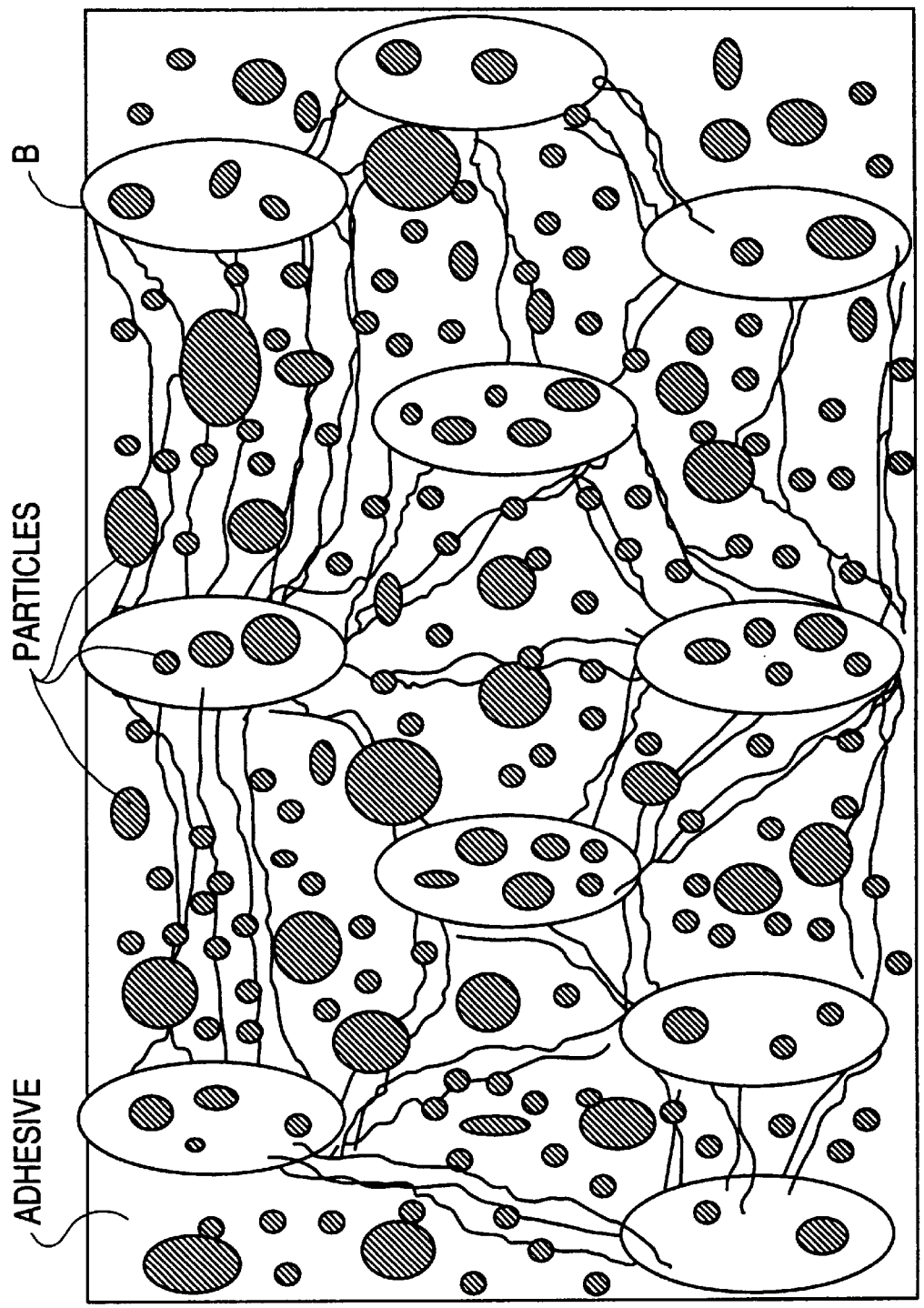
FIG. 3 illustrates an expanded or stretched polytetrafluoroethylene film where the open volume defined by the node-and-fibril structure includes a particle-filled adhesive, and filler particles are also located in the fibril-node structure.

FIG. 3 illustrates how the nodes of film (A) can also possess particles, not necessarily the same ones dispersed within the void volume.

To prepare the filled adhesive film of this invention, particulate filler is mixed into a solvent or aqueous solution or molten adhesive to afford a finely dispersed mixture. The filler in small particle form is ordinarily less than 40 microns in size, and preferably has an average particulate size between 1 and 10 microns. The mean pore size of the node-and-fibril structure of the polytetrafluoroethylene should be large enough to allow for adequate penetration of the particulate. If the substrate is to be expanded polytetrafluoroethylene, then structures similar to those taught in U.S. Pat. No. 4,482,516 to Bowman, et al. are desirable. Desirably, the mean flow pore size (MFPS) should be between about 2 to 5 times or above that of the largest particulate, with a MFPS of greater than about 2.4 times that of the filler being particularly preferred. However, it is also within the scope of the invention that suitable composites can be prepared by selecting the mean flow particle size MFPS to average particle size ratio to be greater than 1.4. Acceptable composites can also be prepared when the minimum pore size to average particle size is at least above 0.8 or the minimum pore size to the maximum particle size is at least above 0.4. The MFPS to particle size ratio ratios being performed with a microtrak FRA analyzer.

Alternatively, another mechanism for gauging relative pore and particle sizes may be calculated as the smallest pore size being not less than about 1.4 times the largest particle size.

Table 1 shows the effect of the relationship of the substrate mean flow pore size (MFPS) and particulate size. When the ratio of the mean flow pore size (MFPS) to largest particulate is 1.4 or less, poor results are observed. In this case, a homogeneous composite is not observed, and most of the particulate filler does not uniformly penetrate the microporous substrate. When the ratio of the MFPS to largest particulate is greater than about 2.0, then a uniform composite is obtained. It is also observed that the larger the ratio of MFPS to largest particulate, the greater the relative case it is to imbibe a homogeneous dispersion into the microporous substrate.

TABLE 1

| Desc. | Substrate Pore Size | | Particle Size | | MFPS ÷ Part$_{Avg}$ | Pore$_{Min}$ ÷ Part$_{Max}$ | Pore$_{Min}$ ÷ Part$_{Avg}$ | Result |
|---|---|---|---|---|---|---|---|---|
| | Min (μm) | MFPS (μm) | Avg (μm) | Max (μm) | | | | |
| PP266-81a | 4 | 7 | 5 | 10 | 1.4 | 0.4 | 0.8 | Poor |
| PP266-81b | 4 | 5 | 5 | 10 | 1.0 | 0.4 | 0.8 | Poor |
| PP266-85 | — | 58 | 5 | 10 | 12.4 | [N/A] | — | Good |
| PP266-92 | 18 | 32 | 6 | 10 | 5.3 | 1.8 | 3.0 | Good |
| PP266-92 | 18 | 32 | 1 | 1 | 32.0 | 18.0 | 18 | Good |
| PP266-94 | 17 | 24 | 6 | 10 | 4.0 | 1.7 | 2.8 | Good |
| PP266-118 | 0.2 | 0.4 | 0.5 | 1.6 | 0.8 | 0.125 | 0.4 | Poor |
| PP279-74 | — | 60 | 18 | 30 | 3.3 | — | — | Good |
| PP279-112 | 14 | [11]19 | 0.5 | 1.6 | [22.0]38 | 8.8 | 28 | Good |
| PP289-4 | 14 | 29 | 4 | 8 | 7.3 | 1.8 | 3.5 | Good |
| PP289-4 | 14 | 29 | 5 | 10 | 5.8 | 1.4 | 2.8 | Good |

The open films are easily imbibed with particulate-filled resin. In this case, all or part of the void volume presently comprising air is replaced with particulate-filled resin/adhesive. In the case where only part of the void volume of air is replaced with resin, the final composite can be compressed in place to a very thin, void-free composite with excellent adhesion, superior thickness control, and excellent flexibility and compressibility. Thus, in this manner, one is capable of making exceptionally thin, well-controlled thicknesses of unusually highly loaded adhesives which were previously unattainable.

Figure 4:
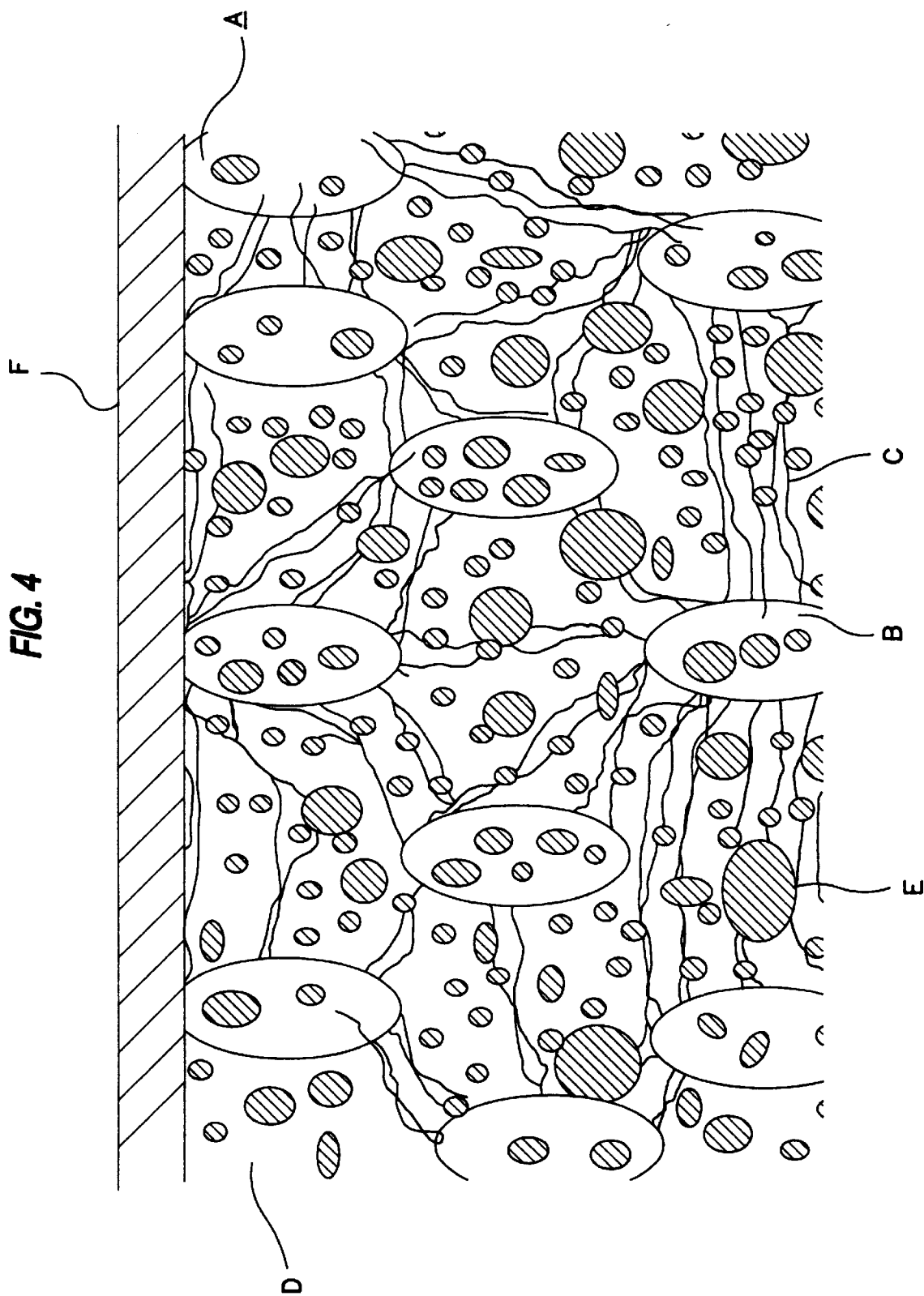
FIG. 4 illustrates a composite of the subject invention adhered to a layer of metal.

FIG. 4 illustrates composite which can be fabricated using the present invention. Adhesive film A containing nodes B interconnected with fibrils C, with adhesive D and particle E is attached to at least one layer of metal F. This construction provides a variety of applications, such as serving as a printed circuit board substrate, a buried capacitor, a thermal heat sink material, etc. A metal layer may also be applied to the opposite side of this material to produce a sandwiched construction.

The following examples illustrate how the present invention may be made and used, without intending to limit the scope of the present invention.

EXAMPLE 1

A fine dispersion was prepared by mixing 281.6 g $TiO_2$ (TI Pure R-900, Du Pont Company) into a 20% (w/w) solution of a flame retarded dicyanamide/2-methylimidazole catalyzed bisphenol-A based polyglycidyl ether (Nelco N-4002-5, Nelco Corp.) in MEK. The dispersion was constantly agitated so as to insure uniformity. A swatch of expanded PTFE was then dipped into the resin mixture. The web was dried at 165° C. for 1 min. under tension to afford a flexible composite. The partially-cured adhesive composite thus produced comprised of 57 weight percent $TiO_2$, 13 weight percent PTFE and 30 weight percent epoxy adhesive. Several plies of the adhesive sheet were laid up between copper foil and pressed at 600 psi in a vacuum-assisted hydraulic press at temperature of 225° C. for 90 min. then cooled under pressure. This resulted in a copper laminate having dielectric constant of 19.0, and withstood a 30 sec. solder shock at 280° C. at an average ply thickness of 100 mm (0.0039"(3.9 mil)) dielectric laminate thickness.

EXAMPLE 2

A fine dispersion was prepared by mixing 44 g Ni powder (Aldrich Chemical Co., Catalog # 26,698-1), 17.4 g of a platinum-cured poly(dimethylsiloxane-methylsiloxane) thermosetting silicone elastomer (Sylgard 4105, Dow Chemical Co.) and 40 g MEK. The dispersion was constantly agitated so as to insure uniformity. A swatch of expanded PTFE was then dipped into the resin mixture. Upon removing the swatch, the excess resin was wiped off the surface of both sides. The web was dried at 165° C. for 1 min. under tension to afford a flexible composite which comprised of 39 weight percent Ni, 10 weight percent PTFE, and 51 weight percent silicone and displayed an electrical conductivity of less than 100 milliohms on a 3 $in^2$ sample, and a thermal impedance of 1.33° C./W.

EXAMPLE 3

A fine dispersion was prepared by mixing 165 g ZnO powder (North American Oxide) into a 20% (w/w) solution of poly(1,2-butadiene-co-styrene) (R-104, Ricon Resins) in MEK. The dispersion was constantly agitated so as to insure uniformity. A swatch of 0.0004" of Copper-filled expanded PTFE (filled according to the teachings of United States Patent application Ser. No. 196,048 filed Feb. 14, 1994 by Ameen, et al. to a level of 40%) was then dipped into the resin mixture. Upon removing the swatch, the excess resin was wiped off the surface of both sides. The web was dried at 165° C. for 1 min. under tension to afford a flexible composite.

EXAMPLE 4

A fine dispersion was prepared by mixing 386 g $SiO_2$ (HW-11-89, Harbison Walker Corp.) which was pretreated with phenyltrimethoxysilane (04330, Huls/Petrarch) into a manganese catalyzed solution of 200 g bismaleimide triazine resin (BT206OBJ, Mitsubishi Gas Chemical) and 388 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 min. then cooled under pressure. This resulting dielectric thus produced comprised of 53 weight percent $SiO_2$, 5 weight percent PTFE and 42 weight percent adhesive, displayed good adhesion to copper, dielectric constant (at 10 GHz) of 3.3 and dissipation factor (at 10 GHz) of 0.005.

EXAMPLE 5

A fine dispersion was prepared by mixing 483 g $SiO_2$ (HW-11-89) into a manganese-catalyzed solution of 274.7 g bismaleimide triazine resin (BT2060BJ, Mitsubishi Gas Chemical) and 485 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 minutes then cooled under pressure. The resulting dielectric thus produced comprised of 57 weight percent $SiO_2$, 4 weight percent PTFE and 39 weight percent adhesive, displayed good adhesion to copper, dielectric constant (at 10 GHz) of 3.2 and dissipation factor (at 10 GHz) of 0.005.

EXAMPLE 6

A fine dispersion was prepared by mixing 15.44 kg $TiO_2$ powder (TI Pure R-900, DuPont Company) into a manganese-catalyzed solution of 3.30 kg bismaleimide triazine resin (BT206OBH, Mitsubishi Gas Chemical) and 15.38 kg MEK. The dispersion was constantly agitated so as to insure uniformity. A swatch of 0.0004" $TiO_2$-filled expanded PTFE (filled according to the teachings of Mortimer U.S. Pat. No. 4,985,296, except to 40% loading of $TiO_2$ and the membrane was not compressed at the end) was then dipped into the resin mixture, removed, and then dried at 165° C. for 1 min. under tension to afford a flexible composite. The partially cured adhesive composite thus produced comprised of 70 weight percent $TiO_2$, 9 weight percent PTFE and 21 weight percent adhesive. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant of 10.0 and dissipation factor of 0.008.

EXAMPLE 7

A fine dispersion was prepared by mixing 7.35 kg $SiO_2$ (ADMATECHS SO-E2, Tatsumori LTD) with 7.35 kg MEK and 73.5 g of coupling agent, i.e.,3-glycidyloxypropyltrimethoxysilane (Dynasylan GLYMO (Petrach Systems). SO-E2 is described by the manufacture as having highly spherical silica having a particle diameter of 0.4 to 0.6 mm, a specific surface area of 4–8$m^2$/g, a bulk density of 0.2–0.4 g/cc (loose).

To this dispersion was added 932 g of a 50% (w/w) solution of a cyanated phenolic resin, Primaset PT-30 (Lonza Corp.). In (MEK) methylethylketone, 896 g of a 50% (w/w) solution of RSL 1462 (Shell Resins, Inc.(CAS #25068-38-6)) in MEK, 380 g of a 50% (w/w) solution of BC-58 (Great Lakes, Inc.) in MEK, 54 g of 50% solution of bisphenol A (Aldrich Company) in MEK, 12.6 g Irganox 1010 (Ciba Geigy), 3.1 g of a 0.6% solution of Manganese 2-ethylhexanoate (Mn HEX-CEM (OMG Ltd.), and 2.40 kg MEK. This dispersion was subjected to ultrasonic agitation through a Misonics continuous flow cell for about 20 minutes at a rate of about 1–3 gal./minute. The fine dispersion thus obtained was further diluted to an overall bath concentration of 11.9% solids (w/w).

Figure 5:
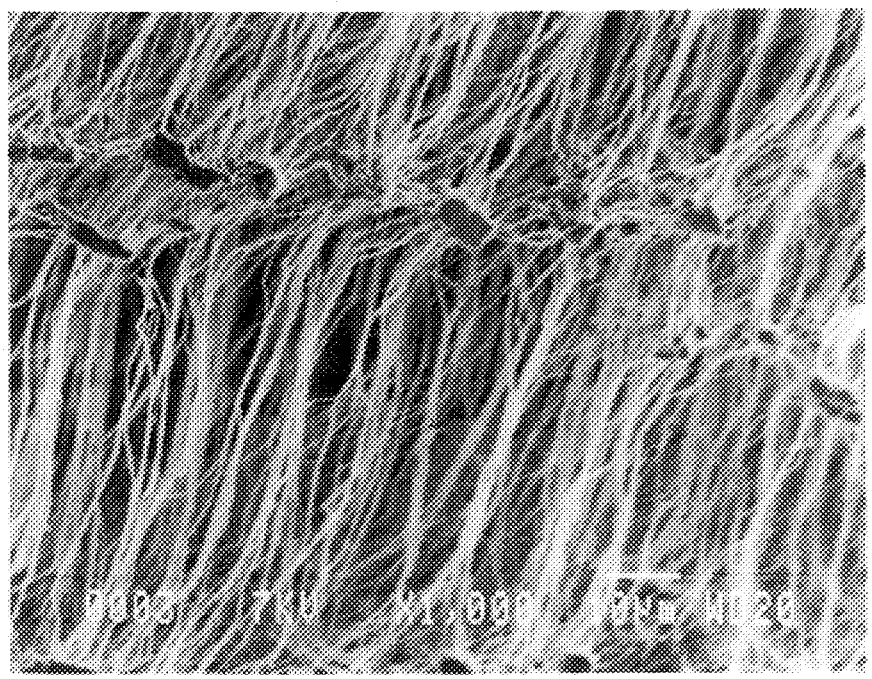
FIG. 5 illustrates a scanning electromicrograph of a preferred ePTFE substrate prior to paste imbibing according to the present invention.

The fine dispersion was poured into an impregnation bath. A expanded polytetrafluoroethylene web having the node fibril structure of FIG. 5, and the following properties:

| Frazier | 20.55 |
|---|---|
| Coverage | 9 g/m$^2$ |
| Ball Burst | 3.2 lbs. |
| Thickness | 6.5 mil. |
| Mean Flow Pore Size | 9.0 microns |

The Frazier number relates to the air permeability of the material being assayed. Air permeability is measured by clamping the web in a gasketed fixture which is provided in circular area of approximately 6 square inches for air flow measurement. The upstream side was connected to a flow meter in line with a source of dry compressed air. The downstream side of the sample fixture was open to the atmosphere. Testing is accomplished by applying a pressure of 0.5 inches of water to the upstream side of the sample and recording the flow rate of the air passing through the in-line flowmeter (a ball-float rotameter that was connected to a flow meter.

The Ball Burst Strength is a test that measures the relative strength of samples by determining the maximum at break. The web is challenged with a 1 inch diameter ball while being clamped between two plates. The Chatillon, Force Gauge Ball/Burst Test was used. The media is placed taut in the measuring device and pressure afixed by raising the web into contact with the ball of the burst probe. Pressure at break is recorded.

The web described above was passed through a constantly agitated impregnation bath at a speed at or about 3 ft./min, so as to insure uniformity. The impregnated web is immediately passed through a heated oven to remove all or nearly all the solvent, and is collected on a roll.

Several plies of this prepeg were laid up between copper foil and pressed at 200 psi in a vacuum-assisted hydraulic press at temperature of 220° C. for 90 minutes and then cooled under pressure. This resulting dielectric displayed good adhesion to copper, dielectric constant (10 GHz) of 3.0 and dissipation factor of 0.0085 (10 GHz).

The physical properties of the particulate filler used in Example 4 and Example 7 are compared below.

| Property | Tatsumori (ADMATECHS) | Harbison Walker |
|---|---|---|
| Manufacture Technique | Vapor Metal Combustion | Amorphous Fused Silica |
| Designation | Silica SO-E2 | HW-11-89 |
| Median Particle Size | 0.5 micron | 5 micron |
| Shape | Spherical | Irregular, jagged |
| Surface Area | 6–10 m$^2$/g | 10 m$^2$/g |
| Bulk Density | 0.47 g/cc | 1.12 g/cc |
| Specific Density | 2.26 g/cc | 2.16 g/cc |

EXAMPLE 8

An ePTFE matrix containing an impregnated adhesive filler mixture, based on SiO$_2$ prepared from the vapor combustion of molten silicon is prepared as follows. Two precursor mixtures were initially prepared. One being in the form of a slurry containing a silane treated silica similar to that of Example 5 and the other an uncatalyzed blend of the resin and other components.

Mixture I

The silica slurry is a 50/50 blend of the SO-E2 silica of Example 5 in MEK, where the silica contains a coated of silane which is equal to 1% of the silica weight. To a five gallon container, 17.5 pounds of MEK and 79 grams of silane were added and the two components mixed to ensure uniform dispersion of the silane in the MEK. Then, 17.5 pounds of the silica of Example 5 were added. Two five gallon containers of the MEK-silica-silane mixture were added to a reaction vessel, and the contents, i.e., the slurry, was recirculated through an ultrasonic disperser for approximately one hour to break up any silica agglomerates that may be present. The sonication was completed and the contents of the reaction vessel were heated to approximately 80° C. for approximately one hour, while the contents were continuously mixed. The reacted mixture was then transferred into a ten gallon container.

Mixture II

The desired resin blend product is an MEK based mixture containing an uncatalyzed resin blend (the adhesive) contains approximately 60% solids, where the solid portion is an exact mixture of 41.2% PT-30 cyanated phenolic resin, 39.5% RSL 1462 epoxy resin, 16.7% BC58 flame retardant, 1.5% Irganox 1010 stabilizer, and 1% bisphenol A co-catalyst, all percentages by weight.

Into a ten gallon container, 14.8 pounds of PT-30 and 15–20 pounds of MEK were added and stirred vigorously to completely solvate the PT-30. Then 6 pounds of BC58 were measured and added to the MEK/PT-30 solution and vigorously agitated to solvate the BC58. The stabilizer, 244.5 grams of Irganox 1010 and bisphenol A, 163 grams were added. The ten gallon container was reweighed and 14.22 pounds of RSL 1462 were added. Additional MEK was added to bring the mixture weight to 60 pounds. The contents were then vigorously agitated for approximately 1 to 2 hours, or as long is necessary to completely dissolve the solid components.

The desired product is a mixture of the silica treated with a silane, the uncatalyzed resin blend, and MEK in which 68% by weight of the solids are silica, and the total solids are between 5% and 50% by weight of the mixture. The exact solids concentration varies from run to run, and depends in part on the membrane to be impregnated. The catalyst level is 10 ppm relative to the sum of the PT-30 and RSL1462.

The solid contents of mixtures I and II were determined to verify the accuracy of the precursors and compensate for any solvent flash that had occurred. Then mixture I was added to a ten gallon container to provide 12 pounds of solids, e.g., 515 solids content, 23.48 pounds of mixture 1. Then mixture II was added to the container to provide 5.64 pounds of solids, e.g., 59.6% solids, 9.46 pounds of mixture II. The manganese catalyst solution (0.6% in mineral spirits), 3.45 grams, was added to the mixture of mixture I and mixture II and blended thoroughly to form a high solids content mixture.

The bath mixture for impregnating an ePTFE matrix, 28% solids mixture, was prepared by adding sufficient MEK to the high solids content mixture to a total weight of 63 pounds.

Thereafter, an ePTFE matrix was impregnated with this bath mixture to form a dielectric material.

EXAMPLE 9

A fine dispersion was prepared by mixing 26.8 grams Furnace Black (Special Schwarz 100, Degussa Corp., Ridgefield Park, N.J.) and 79 grams of coupling agent (Dynaslan GLYMO CAS #2530-83-8; 3-glycidyloxypropyl-trimethoxysilane (Petrach Systems). The dispersion was subjected to ultrasonic agitation for 1 minute, then added to a stirring dispersion of 17.5 pounds $SiO_2$ (SO-E2) in 17.5 pounds MEK which had previously been ultrasonically agitated. The final dispersion was heated with constant overhead mixing for 1 hour at reflux, then allowed to cool to room temperature.

Separately, an adhesive varnish was prepared by adding the following: 3413 grams of a 57.5% (w/w) mixture of Primaset PT-30 in MEK, 2456 grams of a 76.8% (w/w/) mixture of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mu HEX-CEM (OMG Ltd.) in mineral spirits, and 2.40 kg MEK.

In a separate container, 3739 grams of the dispersion described above was added, along with 0.0233 grams of Furnace Black (Special Schwarz 100, Degussa Corp., Ridgefield Park, N.J.), 1328 of the adhesive varnish described above and 38.3 pounds MEK. This mixture was poured into an impregnation bath, and an ePTFE web was passed through the impregnation bath at a speed at or about 3 ft/min. This dispersion was constantly agitated so as to insure uniformity. The impregnated web is immediately passed through a heated oven to remove all or nearly all the solvent, and is collected on a roll.

Several piles of this prepeg were laid up between copper foil and pressed at 200 psi in a vacuum-assisted hydraulic press at temperatures of 200° C. for 90 minutes then cooled under pressure. This resulting dielectric displayed good adhesion to copper.

EXAMPLE 10

An adhesive varnish was prepared by adding the following: 3413 grams of a 57.5% (w/w) solution of Primaset PT-30 (PMN P-88-1591)) in MEK, 2456 grams of a 76.8% (w/w) solution of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mn HEX-CEM in mineral spirits, and 2.40 kg MEK.

In a separate container, 1328 grams of the adhesive varnish described above, 42.3 pounds MEK, 6.40 grams of Furnace Black (Special Schwarz 100, Degussa Corp., Ridgefield, N.J.) and 1860.9 grams $SiO_2$ (SO-E2). This mixture was poured into an impregnation bath, and an ePTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll.

Several piles of this prepeg were laid up between copper foil and pressed at 200 psi in a vacuum-assisted hydraulic press at temperature of 220° C. for 90 minutes then cooled under pressure. This resulting dielectric displayed good adhesion to copper.

EXAMPLE 11

An adhesive varnish was prepared by adding the following: 3413 g of a 57.7% (w/w) solution of Primaset PT-30 (PMN P-88-1591) in MEK, 2456 g of a 76.8% (w/w) solution of RSL 1462 in MEK, 1495 g of a 53.2% (w/w) solution of BC-58 in MEK, 200 g of 23.9% (w/w) solution of bisphenol A (Aldrich Company) in MEK, 71.5 g Irganox 1010, 3.21 g of a 0.6% (w/w) solution of Mn HEX-CEM in mineral spirits, and 2.40 kg MEK.

Separately, a fine black dispersion is prepared by combining 3 g of Furnace Black (Special Schwarz 100, Degussa Corp. Ridgefield Park, N.J.) and 0.12 g of a 5.0% (w/w) mixture of KR55 (2,2, diallyloxymethyl)butyl di(ditrideoyl) phosphito titanate, CAD 64157-148, Kenrich Petrochemicals, Inc., Bayonne, N.J.) and 20 g MEK, then subjecting the dispersion to ultrasonic agitation for 1 minute.

In a separate container, 18 g $SiO_2$ (ADMATECHS SO-EZ, Tatsumori LTD), 0.72 g of a 5.0% (w/w) mixture of 2,2, (diallyloxymethyl)butyl di(ditridecyl)phosphito titanate, KR-55 (CAS 64157-14-8 Kenrich Company, Bayonne, N.J.), 8.56 g of the adhesive varnish described above, and enough of the fine black dispersion described above to supply 0.8% (w/w) carbon black based on the weight of the dry adhesive in the varnish were combined and subjected to ultrasonic agitation for 1 minute. The fine dispersion thus obtained was decanted over a 3" diameter swatch of ePTFE. This impregnation step was repeated for several 3" diameter swatches of ePTFE. The thin adhesive sheet thus obtained was heated in a forced air oven at 163C for 1.5 minutes and allowed to cool to room temperature.

EXAMPLE 12

An adhesive varnish was prepared by adding the following: 3413 g of a 57.5% (w/w) solution of Primaset PT-30 (PMN P-88-1591) in MEK, 2456 g of a 76.8% (w/w) solution of RSL 1462 in MEK, 1495 g of a 53.2% (w/w) solution of BC-58 in MEK, 200 g of 23.9% (w/w) solution of bisphenol A (Aldrich Company) in MEK, 71.5 g Irganox 1010, 3.21 g of a 0/6% (w/w) solution of Mn HEX-CEM in mineral spirits and 2.40 kg MEK.

A dispersion was prepared by adding 18.48 g $SIO_2$ (SO-E2) to a mixture of 18.5 g MEK and 1.85 g hexamethyldisilazane (CAS# 999-97-3, Huls America #H7300) and was subjected to ultrasonic agitation for 1 minute. Finally, 10.28 g of the adhesive varnish described above was added to the dispersion thus obtained was decanted over a 3" diameter swatch of ePTFE. This impregnation step was repeated for several 3" diameter swatches of ePTFE. The thin adhesive sheet thus obtained was heated in a forced air oven at 163C for 1.5 minutes and allowed to cool to room temperature.

EXAMPLE 13

Amorphorous colloidal silica powder 252.3 g (CAS #7631-86-9, GelTech #1.5 micron) was added to 249.8 g of a 61% (w/w) solution of a Manganese-catalyzed cyanate ester bistriazine adhesive varnish (BT2060BJ) and 528 g MEK. The resultant dispersion was subjected to 2 minutes of ultrasonic agitation. The fine dispersion thus obtained was poured into a cylindrical container and a 10" diameter swatch of dPTFE contained within an embroidery hoop was submersed into the impreganation bath. This impregnation step was repeated for several 10" diameter swatches of ePTFE contained within embroidery hoops. The thin adhesive sheet thus obtained was heated in a forced air oven at 163° C. for 1.5 minutes and allowed to cool to room temperature.

EXAMPLE 14

An adhesive varnish was prepared by adding the following: 3413 g of a 57.5% (w/w) solution of Primaset PT-30

(PMN P-88-1591) in MEK, 2456 g of a 76.8% (w/w) solution of RSL 1462 in MEK, 1495 g of a 53.2% (w/w) solution of BC-58 in MEK, 200 g of 23.9% (w/w) solution of bisphenol A in MEK, 71.5 g Irganox 1010, 3.21 g of a 0.6% (w/w) solution of Mn HEX-CEM in mineral spirits, and 2.40 kg MEK.

Separately, a fine black dispersion is prepared by combining 5.09 g of Furnace Black (SpecialSchwarz 100), and 0.2.08 g of a 5.0% (w/w) solution of diisopropyl(oleyl)-acetoacetyl aluminate (KR322, Kenrich®), and 45.06 g MEK. The fine dispersion thus obtained was then subjecting to ultrasonic agitation for 30 seconds.

In a separate container, 34.53 g $SiO_2$ (SO-E2) and 13.88 g of a 5.0% (w/w) solution of diisopropyl(oleyl)acetoacetyl aluminate were added together and subjected to 30 seconds of ultrasonic agitation. With stirring, 19.81 g of the adhesive varnish described above, and 1.66 g of the fine black dispersion described above were added. The fine dispersion thus obtained was then subjected to ultrasonic agitation for 30 seconds, and then decanted over a 3" diameter swatch of ePTFE. This impregnation step was repeated for several 3" diameter swatches of ePTFE. The thin adhesive sheet thus obtained was heated in a forced air oven at 163AC for 1.5 minutes and allowed to cool to room temperature.

While particular embodiments of the present invention have been illustrated and described herein, the present invention should not be limited to such illustrations and descriptions. It should be apparent that changes and modifications may be incorporated and embodied as part of the present invention within the scope of the following claims.

I claim:

1. A composite adhesive material comprising:
   a non-woven substrate having an initial void volume and a mean flow pore size; and
   a mixture containing particulate filler and an adhesive resin, the particulate filler being a collection of individual particles, said collection containing a particle having a largest particle size which is the largest detectable particle in the collection, wherein a ratio of said mean flow pore size to the largest particle size is in a range from about 1.0 to about 1000;
   wherein said mixture is substantially evenly distributed throughout said initial void volume of said non-woven substrate.

2. A composite adhesive material comprising:
   a non-woven substrate having an initial void volume and a mean flow pore size; and
   a mixture containing particulate filler and an adhesive resin, the particulate filler being a collection of individual particles, said collection containing a particle having a largest particle size which is the largest detectable particle in the collection, wherein a ratio of said mean flow pore size to the largest particle size is in a range from about 1.0 to about 500;
   wherein said mixture is substantially evenly distributed throughout said initial void volume of said non-woven substrate.

3. A composite adhesive material comprising:
   a non-woven substrate having an initial void volume and a mean flow pore size; and
   a mixture containing particulate filler and an adhesive resin, the particulate filler being a collection of individual particles, said collection containing a particle having a largest particle size which is the largest detectable particle in the collection, wherein a ratio of said mean flow pore size to the largest particle size is in a range from about 1.0 to about 100;
   wherein said mixture is substantially evenly distributed throughout said initial void volume of said non-woven substrate.

4. A composite adhesive material comprising:
   a non-woven substrate having an initial void volume and a mean flow pore size; and
   a mixture containing particulate filler and an adhesive resin, the particulate filler being a collection of individual particles, said collection containing a particle having a largest particle size which is the largest detectable particle in the collection, wherein a ratio of said mean flow pore size to the largest particle size is in a range from about 10 to about 32;
   wherein said mixture is substantially evenly distributed throughout said initial void volume of said non-woven substrate.

5. A composite adhesive material comprising:
   a non-woven substrate having an initial void volume and a mean flow pore size; and
   a mixture containing particulate filler and an adhesive resin, the particulate filler being a collection of individual particles, said collection containing a particle having a largest particle size which is the largest detectable particle in the collection, wherein a ratio of said mean flow pore size to the largest particle size is in a range from at least above 0.7 to about 32;
   wherein said mixture is substantially evenly distributed throughout said initial void volume of said non-woven substrate.

6. A composite adhesive material comprising:
   a non-woven substrate having an initial void volume and a mean flow pore size; and
   a mixture containing particulate filler and an adhesive resin, the particulate filler being a collection of individual particles having an average particle size, wherein a ratio of said mean flow pore size to the average particle size is in a range from greater than 1.5 to about 1000;
   wherein said mixture is substantially evenly distributed throughout said initial void volume of said non-woven substrate.

7. A composite adhesive material comprising:
   a non-woven substrate having an initial void volume and a mean flow pore size; and
   a mixture containing particulate filler and an adhesive resin, the particulate filler being a collection of individual particles having an average particle size, wherein a ratio of said mean flow pore size to the average particle size is in a range from greater than 1.5 to about 500;
   wherein said mixture is substantially evenly distributed throughout said initial void volume of said non-woven substrate.

8. A composite adhesive material comprising:
   a non-woven substrate having an initial void volume and a mean flow pore size; and
   a mixture containing particulate filler and an adhesive resin, the particulate filler being a collection of individual particles having an average particle size, wherein a ratio of said mean flow pore size to the average particle size is in a range from greater than 1.5 to about 100;

wherein said mixture is substantially evenly distributed throughout said initial void volume of said non-woven substrate.

9. A composite adhesive material comprising:
a non-woven substrate having an initial void volume and a mean flow pore size; and
a mixture containing particulate filler and an adhesive resin, the particulate filler being a collection of individual particles having an average particle size, wherein a ratio of said mean flow pore size to the average particle size is in a range from greater than 1.5 to about 38;
wherein said mixture is substantially evenly distributed throughout said initial void volume of said non-woven substrate.

10. A composite adhesive material comprising:
a non-woven substrate having an initial void volume and a minimum pore size; and
a mixture containing particulate filler and an adhesive resin, the particulate filler being a collection of individual particles having an average particle size, wherein a ratio of said minimum pore size to the average particle size is in a range from at least above 0.8 to about 1000;
wherein said mixture is substantially evenly distributed throughout said initial void volume of said non-woven substrate.

11. A composite adhesive material comprising:
a non-woven substrate having an Initial void volume and a minimum pore size; and
a mixture containing particulate filler and an adhesive resin, the particulate filler being a collection of individual particles having an average particle size, wherein a ratio of said minimum pore size to the average particle size is in a range from at least above 0.8 to about 500;
wherein said mixture is substantially evenly distributed throughout said initial void volume of said non-woven substrate.

12. A composite adhesive material comprising:
a non-woven substrate having an initial void volume and a minimum pore size; and
a mixture containing particulate filler and an adhesive resin, the particulate filler being a collection of individual particles having an average particle size, wherein a ratio of said minimum pore size to the average particle size is in a range from at least above 0.8 to about 100;
wherein said mixture is substantially evenly distributed throughout said initial void volume of said non-woven substrate.

13. A composite adhesive material comprising:
a non-woven substrate having an initial void volume and a minimum pore size; and
a mixture containing particulate filler and an adhesive resin, the particulate filler being a collection of individual particles having an average particle size, wherein a ratio of said minimum pore size to the average particle size is in a range from at least above 0.8 to about 28;
wherein said mixture is substantially evenly distributed throughout said initial void volume of said non-woven substrate.

14. A composite adhesive material comprising:
a non-woven substrate having an initial void volume and a minimum pore size; and
a mixture containing particulate filler and an adhesive resin, the particulate filler being a collection of individual particles, said collection containing a particle having a largest particle size which is the largest detectable particle in the collection, wherein a ratio of said minimum pore size to the largest particle size is in a range from at least above 0.4 to about 1000;
wherein said mixture Is substantially evenly distributed throughout said initial void volume of said non-woven substrate.

15. A composite adhesive material comprising:
a non-woven substrate having an initial void volume and a minimum pore size; and
a mixture containing particulate filler and an adhesive resin, the particulate filler being a collection of individual particles, said collection containing a particle having a largest particle size which is the largest detectable particle in the collection, wherein a ratio of said minimum pore size to the largest particle size is in a range from at least above 0.4 to about 500;
wherein said mixture is substantially evenly distributed throughout said initial void volume of said non-woven substrate.

16. A composite adhesive material comprising:
a non-woven substrate having an initial void volume and a minimum pore size; and
a mixture containing particulate filler and an adhesive resin, the particulate filler being a collection of individual particles, said collection containing a particle having a largest particle size which is the largest detectable particle in the collection, wherein a ratio of said minimum pore size to the largest particle size is in a range from at least above 0.4 to about 100;
wherein said mixture is substantially evenly distributed throughout said initial void volume of said non-woven substrate.

17. A composite adhesive material comprising:
a non-woven substrate having an initial void volume and a minimum pore size; and
a mixture containing particulate filler and an adhesive resin, the particulate filler being a collection of individual particles, said collection containing a particle having a largest particle size which is the largest detectable particle in the collection, wherein a ratio of said minimum pore size to the largest particle size is in a range from at least above 0.4 to about 18;
wherein said mixture is substantially evenly distributed throughout said initial void volume of said non-woven substrate.

18. The composite adhesive material of claims 1, 2, 3, 4, 5, 6, 7, 8, 9, 10, 11, 12, 13, 14, 15, 16, or 17, wherein the non-woven substrate is comprised of a fluoropolymer material.

19. The composite adhesive material of claims 1, 2, 3, 4, 5, 6, 7, 8, 9, 10, 11, 12, 13, 14, 15, 16, or 17, wherein the non-woven substrate is comprised of polytetrafluoroethylene.

20. The composite adhesive material of claims 1, 2, 3, 4, 5, 6, 7, 8, 9, 10, 11, 12, 13, 14, 15, 16, or 17, wherein the non-woven substrate is comprised of expanded polytetrafluoroethylene.

21. The composite adhesive material of claims 1, 2, 3, 4, 5, 6, 7, 8, 9, 10, 11, 12, 13, 14, 15, 16, or 17, wherein the non-woven substrate is comprised of a porous olefin.

22. The composite adhesive material of claims 1, 2, 3, 4, 5, 6, 7, 8, 9, 10, 11, 12, 13, 14, 15, 16, or 17, wherein the non-woven substrate is comprised of polyethylene or polypropylene.

23. The composite adhesive material of claims 1, 2, 3, 4, 5, 6, 7, 8, 9, 10, 11, 12, 13, 14, 15, 16, or 17, wherein said filler is formed from the vapor combustion of molten silicon, titanium or aluminum.

24. The composite adhesive material of claims 1, 2, 3, 4, 5, 6, 7, 8, 9, 10, 11, 12, 13, 14, 15, 16, or 17, wherein said adhesive resin is a thermosetting or thermoplastic compound.

25. The composite adhesive material of claims 1, 2, 3, 4, 5, 6, 7, 8, 9, 10, 11, 12, 13, 14, 15, 16, or 17, wherein said adhesive resin is at least one of epoxy resin, cyanate ester resin or polybutadiene resin.

26. The composite adhesive material of claims 1, 2, 3, 4, 5, 6, 7, 8, 9, 10, 11, 12, 13, 14, 15, 16, or 17, wherein the non-woven substrate is formed from an inorganic or organic batting.

27. The composite adhesive material of claims 1, 2, 3, 4, 5, 6, 7, 8, 9, 10, 11, 12, 13, 14, 15, 16, or 17, wherein the non-woven substrate is formed from short inorganic or organic fibers.

28. The composite adhesive material of claims 1, 2, 3, 4, 5, 6, 7, 8, 9, 10, 11, 12, 13, 14, 15, 16, or 17, wherein the non-woven substrate is formed from an inorganic or organic felt.

29. The composite adhesive material of claims 1, 2, 3, 4, 5, 6, 7, 8, 9, 10, 11, 12, 13, 14, 15, 16, or 17, wherein the non-woven substrate is formed from an organic, open cellular material.

30. The composite adhesive material of claims 1, 2, 3, 4, 5, 6, 7, 8, 9, 10, 11, 12, 13, 14, 15, 16, or 17, wherein the non-woven substrate is bonded to at least one metal material layer to form a multilayer circuit assembly.

31. A composite adhesive material comprising:
at least one porous polymer film layer having nodes, fibrils, and pores, said film layer having a mean flow pore size and having an initial void volume of at least about 30 percent;
said initial void volume containing a mixture of adhesive and particulate filler evenly distributed throughout, said mixture being present in said film layer such that the volume of said film layer is about 5 to about 40 volume percent of said composite adhesive material;
said particulate filler being a collection of individual particles, said collection containing a particle having a largest particle size which is the largest detectable particle in the collection, wherein a ratio of said mean flow pore size to the largest particulate size is greater than 1.0.

32. A composite adhesive material comprising:
at least one porous polymer film layer having nodes, fibrils, and pores, said film layer having a mean flow pore size and having an initial void volume of at least about 30 percent;
said initial void volume containing a mixture of adhesive and particulate filler evenly distributed throughout, said mixture being present in said film layer such that the volume of said film layer is about 5 to about 40 volume percent of said composite adhesive material;
said particulate filler being a collection of individual particles, said collection containing a particle having a largest particle size which is the largest detectable particle in the collection, wherein a ratio of said mean flow pore size to the largest particulate size is greater than 0.7.

33. A composite adhesive material comprising:
at least one porous polymer film layer having nodes, fibrils, and pores, said film layer having a mean flow pore size and having an initial void volume of at least about 30 percent;
said initial void volume containing a mixture of adhesive and particulate filler evenly distributed throughout, said mixture being present in said film layer such that the volume of said film layer is about 5 to about 40 volume percent of said composite adhesive material;
said particulate filler being a collection of individual particles having an average particle size, wherein a ratio of said mean flow pore size to the average particle size is greater than 1.5.

34. A composite adhesive material comprising:
at least one porous polymer film layer having nodes, fibrils, and pores, said film layer having a minimum pore size and having an initial void volume of at least about 30 percent;
said initial void volume containing a mixture of adhesive and particulate filler evenly distributed throughout, said mixture being present in said film layer such that the volume of said film layer is about 5 to about 40 volume percent of said composite adhesive material;
said particulate filler being a collection of individual particles having an average particle size, wherein a ratio of said minimum pore size to the average particle size is at least above 0.8.

35. A composite adhesive material comprising:
at least one porous polymer film layer having nodes, fibrils, and pores, said film layer having a minimum pore size and having an initial void volume of at least about 30 percent;
said initial void volume containing a mixture of adhesive and particulate filler evenly distributed throughout, said mixture being present in said film layer such that the volume of said film layer is about 5 to about 40 volume percent of said composite adhesive material;
said particulate filler being a collection of individual particles, said collection containing a particle having a largest particle size which is the largest detectable particle in the collection, wherein a ratio of said minimum pore size to the largest particulate size is at least above 0.4.

36. The composite adhesive material according to claims 31, 32, 33, 34, or 35, wherein said porous polymer film layer is a fluoropolymer material.

37. The composite adhesive material according to claims 31, 32, 33, 34, or 35, wherein said porous polymer film layer is comprised at least in part of polytetrafluoroethylene.

38. The composite adhesive material according to claims 31, 32, 33, 34, or 35, wherein said porous polymer film layer is comprised at least in part of expanded polytetrafluoroethylene.

39. The composite adhesive material according to claims 31, 32, 33, 34, or 35, wherein said porous polymer film layer is comprised at least in part of a porous olefin.

40. The composite adhesive material according to claims 31, 32, 33, 34, or 35, wherein said porous polymer film layer is comprised at least in part of polyethylene or polypropylene.

41. The composite adhesive material according to claims 31, 32, 33, 34, or 35, wherein said filler is formed from the vapor combustion of molten aluminum, silicon or titanium.

42. The composite adhesive material of claims 31, 32, 33, 34, or 35 wherein the porous polymer film layer Is bonded to at least one metal material layer to form a multilayer circuit assembly.

43. A composite adhesive material comprising:
  a porous fluoropolymer substrate having an initial void volume and a mean flow pore size; and
  a mixture containing particulate filler and an adhesive resin, the particulate filler being a collection of individual particles, said collection containing a particle having a largest particle size which is the largest detectable particle in the collection, wherein a ratio of said mean flow pore size to the largest particle size is in a range from about 1.0 to about 1000;
  wherein said mixture is distributed throughout said initial void volume of said porous fluoropolymer substrate.

44. A composite adhesive material comprising:
  a porous fluoropolymer substrate having an initial void volume and a mean flow pore size; and
  a mixture containing particulate filler and an adhesive resin, the particulate filler being a collection of individual particles, said collection containing a particle having a largest particle size which is the largest detectable particle in the collection, wherein a ratio of said mean flow pore size to the largest particle size is in a range from about 1.0 to about 500;
  wherein said mixture is distributed throughout said initial void volume of said porous fluoropolymer substrate.

45. A composite adhesive material comprising:
  a porous fluoropolymer substrate having an initial void volume and a mean flow pore size; and
  a mixture containing particulate filler and an adhesive resin, the particulate filler being a collection of individual particles, said collection containing a particle having a largest particle size which is the largest detectable particle in the collection, wherein a ratio of said mean flow pore size to the largest particle size is in a range from about 1.0 to about 100;
  wherein said mixture is distributed throughout said initial void volume of said porous fluoropolymer substrate.

46. A composite adhesive material comprising:
  a porous fluoropolymer substrate having an initial void volume and a mean flow pore size; and
  a mixture containing particulate filler and an adhesive resin, the particulate filler being a collection of individual particles, said collection containing a particle having a largest particle size which is the largest detectable particle in the collection, wherein a ratio of said mean flow pore size to the largest particle size is in a range from about 1.0 to about 32;
  wherein said mixture is distributed throughout said initial void volume of said porous fluoropolymer substrate.

47. A composite adhesive material comprising:
  a porous fluoropolymer substrate having an initial void volume and a mean flow pore size; and
  a mixture containing particulate filler and an adhesive resin, the particulate filler being a collection of individual particles, said collection containing a particle having a largest particle size which is the largest detectable particle in the collection, wherein a ratio of said mean flow pore size to the largest particle size is in a range from at least above 0.7 to about 32;
  wherein said mixture is distributed throughout said initial void volume of said porous fluoropolymer substrate.

48. A composite adhesive material comprising:
  a porous fluoro polymer substrate having an initial void volume and a mean flow pore size; and
  a mixture containing particulate filler and an adhesive resin, the particulate filler being a collection of individual particles having an average particle size, wherein a ratio of said mean flow pore size to the average particle size is in a range from greater than 1.5 to about 1000;
  wherein said mixture is distributed throughout said initial void volume of said porous fluoropolymer substrate.

49. A composite adhesive material comprising:
  a porous fluoropolymer substrate having an initial void volume and a mean flow pore size; and
  a mixture containing particulate filler and an adhesive resin, the particulate filler being a collection of individual particles having an average particle size, wherein a ratio of said mean flow pore size to the average particle size is in a range from greater than 1.5 to about 500;
  wherein said mixture is distributed throughout said initial void volume of said porous fluoropolymer substrate.

50. A composite adhesive material comprising:
  a porous fluoropolymer substrate having an initial void volume and a mean flow pore size; and
  a mixture containing particulate filler and an adhesive resin, the particulate filler being a collection of individual particles having an average particle size, wherein a ratio of said mean flow pore size to the average particle size is in a range from greater than 1.5 to about 100;
  wherein said mixture is distributed throughout said initial void volume of said porous fluoropolymer substrate.

51. A composite adhesive material comprising:
  a porous fluoropolymer substrate having an initial void volume and a mean flow pore size; and
  a mixture containing particulate filler and an adhesive resin, the particulate filler being a collection of individual particles having an average particle size, wherein a ratio of said mean flow pore size to the average particle size is in a range from greater than 1.5 to about 38;
  wherein said mixture is distributed throughout said initial void volume of said porous fluoropolymer substrate.

52. A composite adhesive material comprising:
  a porous fluoropolymer substrate having an initial void volume and a minimum pore size; and
  a mixture containing particulate filler and an adhesive resin, the particulate filler being a collection of individual particles having an average particle size, wherein a ratio of said minimum pore size to the average particle size is in a range from at least above 0.8 to about 1000;
  wherein said mixture is distributed throughout said initial void volume of said porous fluoropolymer substrate.

53. A composite adhesive material comprising:
  a porous fluoropolymer substrate having an initial void volume and a minimum pore size; and
  a mixture containing particulate filler and an adhesive resin, the particulate filler being a collection of individual particles having an average particle size, wherein a ratio of said minimum pore size to the average particle size is in a range from at least above 0.8 to about 500;
  wherein said mixture is distributed throughout said initial void volume of said porous fluoropolymer substrate.

54. A composite adhesive material comprising:
a porous fluoropolymer substrate having an initial void volume and a minimum pore size; and
a mixture containing particulate filler and an adhesive resin, the particulate filler being a collection of individual particles having an average particle size, wherein a ratio of said minimum pore size to the average particle size is in a range from at least above 0.8 to about 100;
wherein said mixture is distributed throughout said initial void volume of said porous fluoropolymer substrate.

55. A composite adhesive material comprising:
a porous fluoropolymer substrate having an initial void volume and a minimum pore size; and
a mixture containing particulate filler and an adhesive resin, the particulate filler being a collection of individual particles having an average particle size, wherein a ratio of said minimum pore size to the average particle size is in a range from at least above 0.8 to about 28;
wherein said mixture is distributed throughout said initial void volume of said porous fluoropolymer substrate.

56. A composite adhesive material comprising:
a porous fluoropolymer substrate having an initial void volume and a minimum pore size; and
a mixture containing particulate filler and an adhesive resin, the particulate filler being a collection of individual particles, said collection containing a particle having a largest particle size which is the largest detectable particle in the collection, wherein a ratio of said minimum pore size to the largest particle size is in a range from greater than 0.4 to about 1000;
wherein said mixture is distributed throughout said initial void volume of said a porous fluoropolymer substrate.

57. A composite adhesive material comprising:
a porous fluoropolymer substrate having an initial void volume and a minimum pore size; and
a mixture containing particulate filler and an adhesive resin, the particulate filler being a collection of individual particles, said collection containing a particle having a largest particle size which is the largest detectable particle in the collection, wherein a ratio of said minimum pore size to the largest particle size is in a range from greater than 0.4 to about 500;
wherein said mixture is distributed throughout said initial void volume of said a porous fluoropolymer substrate.

58. A composite adhesive material comprising:
a porous fluoropolymer substrate having an initial void volume and a minimum pore size; and
a mixture containing particulate filler and an adhesive resin, the particulate filler being a collection of individual particles, said collection containing a particle having a largest particle size which is the largest detectable particle in the collection, wherein a ratio of said minimum pore size to the largest particle size is in a range from greater than 0.4 to about 100;
wherein said mixture is distributed throughout said initial void volume of said a porous fluoropolymer substrate.

59. A composite adhesive material comprising:
a porous fluoropolymer substrate having an initial void volume and a minimum pore size; and
a mixture containing particulate filler and an adhesive resin, the particulate filler being a collection of individual particles, said collection containing a particle having a largest particle size which is the largest detectable particle in the collection, wherein a ratio of said minimum pore size to the largest particle size is in a range from greater than 0.4 to about 18;
wherein said mixture is distributed throughout said initial void volume of said a porous fluoropolymer substrate.

60. A composite adhesive material comprising:
an expanded polytetrafluoroethylene substrate having an initial void volume and a mean flow pore size; and
a mixture containing particulate filler and an adhesive resin, the particulate filler being a collection of individual particles, said collection containing a particle having a largest particle size which is the largest detectable particle in the collection, wherein a ratio of said mean flow pore size to the largest particle size is at least 1.0;
wherein said mixture is distributed throughout said initial void volume of said expanded polytetrafluoroethylene substrate.

61. A composite adhesive material comprising:
an expanded polytetrafluoroethylene substrate having an initial void volume and a mean flow pore size; and
a mixture containing particulate filler and an adhesive resin, the particulate filler being a collection of individual particles, said collection containing a particle having a largest particle size which is the largest detectable particle in the collection, wherein a ratio of said mean flow pore size to the largest particle size is above at least above 0.7;
wherein said mixture is distributed throughout said initial void volume of said expanded polytetrafluoroethylene substrate.

62. A composite adhesive material comprising:
an expanded polytetrafluoroethylene substrate having an initial void volume and a mean flow pore size; and
a mixture containing particulate filler and an adhesive resin, the particulate filler being a collection of individual particles having an average particle size, wherein a ratio of said mean flow pore size to the average particle size is greater than 1.5;
wherein said mixture is distributed throughout said initial void volume of said expanded polytetrafluoroethylene substrate.

63. A composite adhesive material comprising:
an expanded polytetrafluoroethylene substrate having an initial void volume and a minimum pore size; and
a mixture containing particulate filler and an adhesive resin, the particulate filler being a collection of individual particles having an average particle size, wherein a ratio of said minimum pore size to the average particle size is at least above 0.8;
wherein said mixture is distributed throughout said initial void volume of said expanded polytetrafluoroethylene substrate.

64. A composite adhesive material comprising:
an expanded polytetrafluoroethylene substrate having an initial void volume and a minimum pore size; and
a mixture containing particulate filler and an adhesive resin, the particulate filler being a collection of individual particles, said collection containing a particle having a largest particle size which is the largest detectable particle in the collection, wherein a ratio of said minimum pore size to the largest particle size is at least above 0.4;

wherein said mixture is distributed throughout said initial void volume of said expanded polytetrafluoroethylene substrate.

65. The composite adhesive material of claims 43, 44, 45, 46, 47, 48, 49, 50, 51, 52, 53, 54, 55, 56, 57, 58, 59, 60, 61, 62, 63, or 64, wherein said filler is formed from the vapor combustion of molten aluminum, silicon or titanium.

66. The composite adhesive material of claims 43, 44, 45, 46, 47, 48, 49, 50, 51, 52, 53, 54, 55, 56, 57, 58, or 59, wherein the porous fluoropolymer substrate is bonded to at least one metal material layer to form a multilayer circuit assembly.

67. The composite adhesive material of claims 60, 61, 62, 63, or 64, wherein the expanded polytetrafluoroethylene substrate is bonded to at least one metal material layer to form a multilayer circuit assembly.

68. A composite adhesive material comprising:
   at least one porous polymer film layer having nodes, fibrils, and pores, said film layer having a mean flow pore size and having an initial void volume;
   said initial void volume containing a mixture of an adhesive and a particulate filler evenly distributed throughout;
   said particulate filler being a collection of individual particles, said collection containing a particle having a largest particle size which is the largest detectable particle in the collection, wherein a ratio of said mean flow pore size to the largest particle size is greater than 1.0.

69. A composite adhesive material comprising:
   at least one porous polymer film layer having nodes, fibrils, and pores, said film layer having a mean flow pore size and having an initial void volume;
   said initial void volume containing a mixture of an adhesive and a particulate filler evenly distributed throughout;
   said particulate filler being a collection of individual particles, said collection containing a particle having a largest particle size which is the largest detectable particle in the collection, wherein a ratio of said mean flow pore size to the largest particle size is greater than 0.7.

70. A composite adhesive material comprising:
   at least one porous polymer film layer having nodes, fibrils, and pores, said film layer having a mean flow pore size and having an initial void volume;
   said initial void volume containing a mixture of an adhesive and a particulate filler evenly distributed throughout;
   said particulate filler being a collection of individual particles having an average particle size, wherein a ratio of said mean flow pore size to the average particle size is greater than 1.5.

71. A composite adhesive material comprising:
   at least one porous polymer film layer having nodes, fibrils, and pores, said film layer having a minimum pore size and having an initial void volume;
   said initial void volume containing a mixture of an adhesive and a particulate filler evenly distributed throughout;
   said particulate filler being a collection of individual particles having an average particle size, wherein a ratio of said minimum pore size to the average particle size is at least above 0.8.

72. A composite adhesive material comprising:
   at least one porous polymer film layer having nodes, fibrils, and pores, said film layer having a minimum pore size and having an initial void volume;
   said initial void volume containing a mixture of an adhesive and a particulate filler evenly distributed throughout;
   said particulate filler being a collection of individual particles, said collection containing a particle having a largest particle size which is the largest detectable particle in the collection, wherein a ratio of said minimum pore size to the largest particle size is at least above 0.4.

73. The composite adhesive material according to claims 68, 69, 70, 71, or 72, wherein said porous polymer film layer is a fluoropolymer material.

74. The composite adhesive material according to claims 68, 69, 70, 71, or 72, wherein said porous polymer film layer is comprised at least in part of polytetrafluoroethylene.

75. The composite adhesive material according to claims 68, 69, 70, 71, or 72, wherein said porous polymer film layer is comprised at least in part of expanded polytetrafluoroethylene.

76. The composite adhesive material according to claims 68, 69, 70, 71, or 72, wherein said porous polymer film layer is comprised at least in part of a porous olefin.

77. The composite adhesive material according to claims 68, 69, 70, 71, or 72, wherein said porous polymer film layer is comprised at least in part of polyethylene or polypropylene.

78. The composite adhesive material according to claims 68, 69, 70, 71, or 72, wherein said filler is formed from the vapor combustion of molten aluminum, silicon or titanium.

79. The composite adhesive material of claims 68, 69, 70, 71, or 72, wherein the porous polymer film layer is bonded to at least one metal material layer to form a multilayer circuit assembly.

80. A multilayer circuit device comprising:
   at least two metal layers; and
   a dielectric material having a porous polymer substrate layer having a microstructure defined by nodes and fibrils;
   the porous polymer substrate layer having a mean flow pore size, a minimum pore size and an initial void volume;
   wherein a mixture containing particulate filler and an adhesive is evenly distributed throughout said initial void volume, the particulate filler being a collection of individual particles having an average particle size, said collection containing a particle having a largest particle size which is the largest detectable particle in the collection, wherein a ratio of said mean flow pore size to the largest particle size is at least above 1.0, or a ratio of said mean flow pore size to the average particle size is at least above 1.5, or a ratio of minimum pore size to the average particle size or the largest particle size is respectively at least above 0.8 and 0.4.

* * * * *